US009479175B2

(12) United States Patent
Kurokawa

(10) Patent No.: US 9,479,175 B2
(45) Date of Patent: Oct. 25, 2016

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 78 days.

(21) Appl. No.: 14/612,401

(22) Filed: Feb. 3, 2015

(65) Prior Publication Data

US 2015/0229309 A1    Aug. 13, 2015

(30) Foreign Application Priority Data

Feb. 7, 2014   (JP) ................... 2014-022552

(51) Int. Cl.
*G11C 11/4072* (2006.01)
*H03K 19/177* (2006.01)
*G11C 7/20* (2006.01)

(52) U.S. Cl.
CPC ........... *H03K 19/17728* (2013.01); *G11C 7/20* (2013.01); *G11C 11/4072* (2013.01); *H03K 19/17792* (2013.01)

(58) Field of Classification Search
CPC ............... H03K 19/17728; H03K 19/17772; H03K 19/177792; G11C 7/20; G11C 11/405; G11C 11/4072
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,883,092 B2 | 4/2005 | Sasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Patrick O'Neill
(74) *Attorney, Agent, or Firm* — Fish & Richardson P.C.

(57) ABSTRACT

A semiconductor in which the area of a circuit that is unnecessary during normal operation is small is provided. A semiconductor device including a first circuit has a function of storing a start-up routine in the first circuit and executing the start-up routine, a function of operating the first circuit as a buffer memory device after executing the start-up routine, and a function of loading the start-up routine into the first circuit from outside before the semiconductor device is powered off.

16 Claims, 30 Drawing Sheets

(56) References Cited

U.S. PATENT DOCUMENTS

| | | | |
|---|---|---|---|
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,505,317 B2 * | 3/2009 | Crook | G11C 7/20 365/154 |
| 7,598,769 B2 | 10/2009 | Leung | |
| 7,674,650 B2 | 3/2010 | Akimoto et al. | |
| 7,732,819 B2 | 6/2010 | Akimoto et al. | |
| 8,675,382 B2 | 3/2014 | Kurokawa et al. | |
| 9,172,370 B2 * | 10/2015 | Ikeda | H03K 19/0016 |
| 9,287,878 B2 * | 3/2016 | Bjorklund | H03K 19/1776 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2015/0207509 A1 | 7/2015 | Kurokawa | |
| 2015/0227378 A1 | 8/2015 | Kurokawa | |
| 2015/0227379 A1 | 8/2015 | Kurokawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-196097 A | 7/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of Then Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generational Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System"Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest D9 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—IN2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15h International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Noguchi.H et al., "Variable Nonvolatile Memory Arrays for Adaptive Computing Systems", IEDM 13: Technical Digest of International Electron Devices Meeting, Dec. 9, 2013, pp. 617-620.

\* cited by examiner

SEMICONDUCTOR DEVICE AND ELECTRONIC DEVICE

BACKGROUND OF THE INVENTION

1. Field of the Invention

One embodiment of the present invention relates to a semiconductor device including a memory circuit. Alternatively, one embodiment of the present invention relates to a semiconductor device including a memory circuit and a programmable logic device in which the configuration of hardware can be changed.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

A processor executes a program called a start-up routine when it is booted. Although it depends on the environment in which the processor executes a program, the start-up routine includes processes necessary before the main routine is executed, such as setting a variety of registers, copying minimally necessary programs from a memory device outside the processor into a cache memory, and setting the cache memory to a usable state. A specific example of the setting of a variety of registers is a setting for an external peripheral device connected to the processor, such as a latency setting for a DRAM that is a main memory device.

In many cases, the start-up routine is stored in a nonvolatile memory device outside the processor. A mask ROM, a PROM, an EPROM, a flash memory, or the like is normally used as a nonvolatile memory device for storing the start-up routine. Patent Document 1 discloses a processor which includes a power-on determination circuit for determining whether power has been turned on for a system or for periodic operation and therefore does not require an operation to read table data of initial values from a boot ROM when power has been turned on for the periodic operation.

REFERENCE

[Patent Document 1] Japanese Published Patent Application No. 2003-196097

SUMMARY OF THE INVENTION

The boot time of the processor depends on the speed of reading data from the nonvolatile memory where the start-up routine is stored. Therefore, a structure in which the processor and the nonvolatile memory where the start-up routine is stored are contained in the same chip can increase the speed of data reading and is thus effective in shortening the boot time of the processor. Although the nonvolatile memory is needed when the start-up routine is executed, i.e., when the processor is booted, the nonvolatile memory is unnecessary after the processor is booted and starts normal operation. In this regard, the structure in which the nonvolatile memory and the processor are contained in the same chip might cause a decrease in area efficiency and an increase in chip cost.

In view of the foregoing technical background, an object of one embodiment of the present invention is to provide a semiconductor device in which the area of a circuit that is unnecessary during normal operation is small.

An object of one embodiment of the present invention is to provide a novel semiconductor device or the like. Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device which includes a first circuit, a second circuit, a third circuit, a fourth circuit, a fifth circuit, a sixth circuit, and a seventh circuit. The first circuit has a function of storing a program in a first period and a function of operating as a buffer memory device for storing data for the second circuit in a second period. The second circuit has a function of executing the program in the second period. The first period includes a period in which the supply of first power is stopped. The second period includes a period in which the first power is supplied. The third circuit has a function of measuring the length of the first period. The fourth circuit has a function of operating to start the supply of the first power to the second circuit when the second period starts. The fifth circuit has a function of storing data on the length of the first period measured by the third circuit. The sixth circuit has a function of determining whether the program or the data requested by the second circuit is stored in the first circuit or not in the case where the first circuit operates as the buffer memory device. The seventh circuit has a function of supplying second power to the fourth circuit and the fifth circuit. The first circuit includes a plurality of eighth circuits. Each of the plurality of eighth circuits includes a first transistor, a second transistor, a ninth circuit, and a tenth circuit. The first transistor and the second transistor are electrically connected to each other in series. A gate of the first transistor is electrically connected to an output terminal of the ninth circuit. The gate of the first transistor is electrically connected to an input terminal of the tenth circuit. An input terminal of the ninth circuit is electrically connected to an output terminal of the tenth circuit. The ninth circuit includes a third transistor and a fourth transistor. The tenth circuit includes a fifth transistor and a sixth transistor. The first transistor, the second transistor, the third transistor, and the fifth transistor have a first polarity. The fourth transistor and the sixth transistor have a second polarity. A channel portion of the first transistor, a channel portion of the second transistor, a channel portion of the third transistor, and a channel portion of the fifth transistor contain a first semiconductor material and have a first crystalline structure. A channel portion of the fourth transistor and a channel portion of the sixth transistor contain a second semiconductor material and have a second crystalline structure.

One embodiment of the present invention is a semiconductor device including a first circuit. The semiconductor device has a function of storing a start-up routine in the first circuit and executing the start-up routine, a function of operating the first circuit as a buffer memory device after executing the start-up routine, and a function of loading the start-up routine into the first circuit from outside before the semiconductor device is powered off. The first circuit includes a plurality of second circuits. Each of the plurality of second circuits includes a first transistor, a second transistor, a third circuit, and a fourth circuit. The first transistor and the second transistor are electrically connected to each other in series. A gate of the first transistor is electrically connected to an output terminal of the third circuit. The gate of the first transistor is electrically connected to an input terminal of the fourth circuit. An input terminal of the third circuit is electrically connected to an output terminal of the fourth circuit. The third circuit includes a third transistor and a fourth transistor. The fourth circuit includes a fifth transistor and a sixth transistor. The first transistor, the second transistor, the third transistor, and the fifth transistor have a first polarity. The fourth transistor and the sixth transistor have a second polarity. A channel portion of the first transistor, a channel portion of the second transistor, a channel portion of the third transistor, and a channel portion of the fifth transistor contain a first semiconductor material and have a first crystalline structure. A channel portion of the fourth transistor and a channel portion of the sixth transistor contain a second semiconductor material and have a second crystalline structure.

The semiconductor device may have a function of measuring the length of the period in which the supply of power is stopped, and a function of comparing the length of the period in which the supply of power is stopped with the length of a preset period after the power is supplied and executing the start-up routine after loading the start-up routine into the first circuit from outside when the period in which the supply of power is stopped is longer than the preset period or executing the start-up routine stored in the first circuit when the period in which the supply of power is stopped is shorter than the preset period.

In one embodiment of the present invention, in the semiconductor device, the first semiconductor material may be silicon, and the second semiconductor material may be an oxide semiconductor.

In one embodiment of the present invention, in the semiconductor device, the oxide semiconductor may contain In, Ga, and Zn.

Another embodiment of the present invention is an electronic device including the above-described semiconductor device and a display device.

One embodiment of the present invention can provide a semiconductor device in which the area of a circuit that is unnecessary during normal operation is small.

Note that one embodiment of the present invention can provide a novel semiconductor device or the like. Note that the description of these effects does not disturb the existence of other effects. One embodiment of the present invention does not necessarily achieve all the above effects. Other effects will be apparent from and can be derived from the description of the specification, the drawings, the claims, and the like.

DETAILED DESCRIPTION OF THE INVENTION

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that a "source" of a transistor in this specification means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

<Structural Example 1 of Semiconductor Device>

Figure 1:
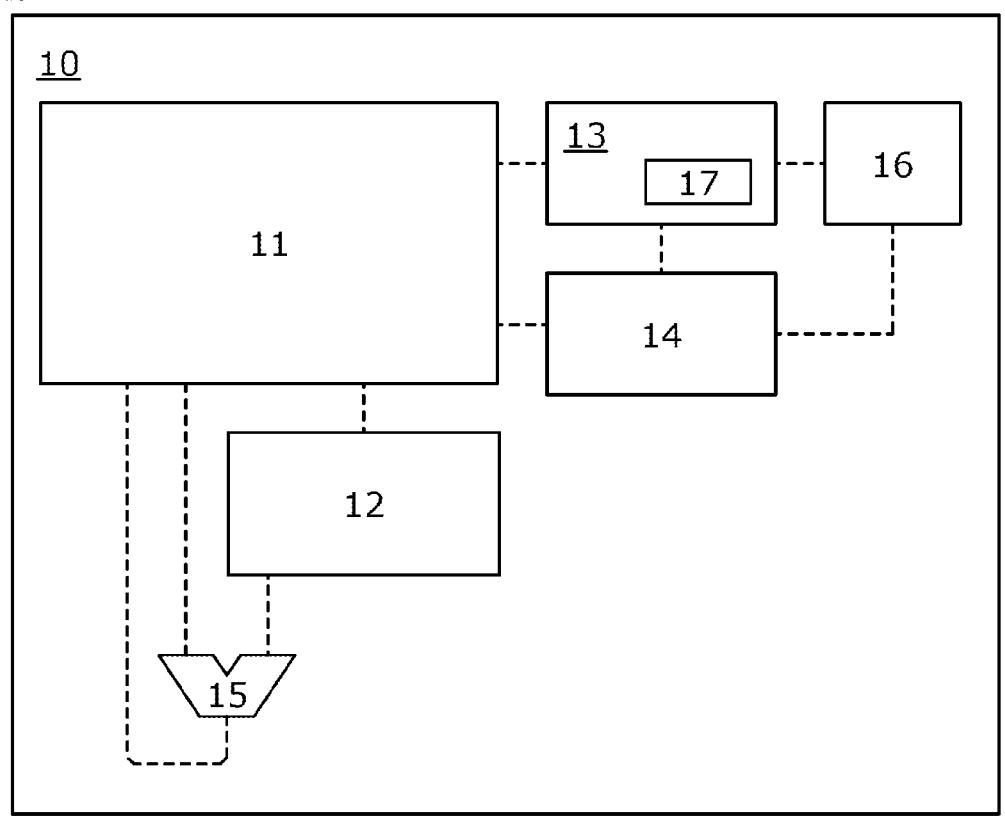
FIG. 1 illustrates a structure of a semiconductor device.

First, a structural example of a semiconductor device of one embodiment of the present invention will be described. FIG. 1 illustrates a structure of a semiconductor device 10 of one embodiment of the present invention.

The semiconductor device 10 in FIG. 1 includes a processor 11, a memory circuit 12, a power management unit (PMU) 13, a register 14, a comparator circuit 15, and a power supply 16.

The processor 11 has a function of executing a variety of programs by controlling the overall operations of the memory circuit 12, the PMU 13, the register 14, and the like. The memory circuit 12 has a function of storing a variety of data. The memory circuit 12 can retain data stored therein even in a period where the supply of power to the memory circuit 12 is stopped. A specific structure of the memory circuit 12 and an operation thereof will be described later. In one embodiment of the present invention, the memory circuit 12 can store data on a start-up routine to be executed when the processor 11 is booted. In addition, in one embodiment of the present invention, the memory circuit 12 can function as a buffer memory device (cache memory) of the processor 11 after the processor 11 is booted. In the case where the memory circuit 12 functions as a buffer memory device of the processor 11, the memory circuit 12 may store a variety of programs to be executed by the processor 11, data used for a variety of arithmetic operations performed by the processor 11, data obtained by the variety of arithmetic operations, or the like.

Note that the processor 11 may have another function, or may lack part of the function, for example. Therefore, the processor 11 may be referred to simply as a circuit, or may be referred to as a first circuit, a second circuit, or the like.

Note that the memory circuit 12 may have another function, or may lack part of the function, for example. Therefore, the memory circuit 12 may be referred to simply as a circuit, or may be referred to as a first circuit, a second circuit, or the like.

The comparator circuit 15 has a function of determining whether data requested by the processor 11 is stored in the memory circuit 12 or not in the case where the memory circuit 12 functions as a buffer memory device.

Note that the comparator circuit 15 may have another function, or may lack part of the function, for example. Therefore, the comparator circuit 15 may be referred to simply as a circuit, or may be referred to as a first circuit, a second circuit, or the like.

The PMU 13 has a function of operating to start the supply of power to the processor 11 and the memory circuit 12 when the supply of power to the semiconductor device 10 from outside is started. Furthermore, the PMU 13 may have a function of operating to start the supply of a variety of drive signals, such as a clock signal, necessary for the operation of the processor 11 or the memory circuit 12 to the processor 11 or the memory circuit 12 when the supply of power to the semiconductor device 10 is started.

The PMU 13 includes a counter 17. The counter 17 has a function of measuring a period in which the supply of power to the semiconductor device 10 from outside is stopped. The register 14 has a function of storing data on the measured period. Note that although FIG. 1 illustrates an example of the semiconductor device 10 in which the counter 17 is a component of the PMU 13, the counter 17 may be separate from the PMU 13 in the semiconductor device 10. Although FIG. 1 illustrates an example in which the register 14 is separate from the PMU 13 in the semiconductor device 10, the register 14 may be a component of the PMU 13.

In addition to the data on the above period, the register 14 may store data for determining whether to load the start-up routine into the memory circuit 12 from the outside of the semiconductor device 10 when the supply of power to the semiconductor device 10 from outside is resumed.

Note that the PMU 13 may have another function, or may lack part of the function, for example. Therefore, the PMU 13 may be referred to simply as a circuit, or may be referred to as a first circuit, a second circuit, or the like.

Note that the counter 17 may have another function, or may lack part of the function, for example. Therefore, the counter 17 may be referred to simply as a circuit, or may be referred to as a first circuit, a second circuit, or the like.

Note that the register 14 may have another function, or may lack part of the function, for example. Therefore, the register 14 may be referred to simply as a circuit, or may be referred to as a first circuit, a second circuit, or the like.

The power supply 16 has a function of supplying power to the PMU 13 and the register 14 in a period where the supply of power to the semiconductor device 10 from outside is stopped. In the case where the counter 17 is separate from the PMU 13 in the semiconductor device 10, the power supply 16 has a function of supplying power to the counter 17 in addition to the PMU 13 and the register 14 in the period where the supply of power to the semiconductor device 10 from outside is stopped.

As the power supply 16, specifically, a primary battery, a power storage device such as a capacitor or a secondary battery, or the like can be used. As the secondary battery, a lead-acid battery, a nickel-cadmium battery, a nickel-hydride battery, or a lithium-ion battery can be used, for example. As the capacitor, an electric double layer capacitor, or a hybrid capacitor in which one of a pair of electrodes has an electric double layer structure and the other of the pair of electrodes utilizes an oxidation-reduction reaction, can be used, for example. The hybrid capacitor, for example, includes a lithium ion capacitor in which a positive electrode has an electric double layer structure and a negative electrode has a lithium ion secondary battery structure. In the case where the power storage device such as the capacitor or the secondary battery is used as the power supply 16, a charge control circuit for preventing overcharge or overdischarge of the power storage device may be provided in the semiconductor device 10.

The power supply 16 may include a circuit such as a DC-DC converter, a step-up circuit, or a step-down circuit. That is, the power supply 16 may have a function of generating a plurality of potentials. In that case, the power supply 16 can have a function of a power supply circuit.

The power supply 16 may have a function of receiving power wirelessly. That is, the power supply 16 may be charged with power that is supplied from outside through the use of a magnetic field, an electric field, an electromagnetic field, or the like. Therefore, the power supply 16 may include a rectifier circuit, a smoothing circuit, or the like. Alternatively, the power supply 16 may include an AC-DC converter or the like.

Note that the power supply 16 is not necessarily provided in the semiconductor device 10. The power supply 16 may be provided outside the semiconductor device 10, or a power supply which supplies power to the semiconductor device 10 may be used in addition to the power supply 16. That is, a power supply which supplies power to the PMU 13 and the register 14 and a power supply which supplies power to the other components may be separately provided. Alternatively, a single power supply may be provided to supply power to the PMU 13, the register 14, and the other components, and the supply of power to each component may be individually controlled. For example, the supply of power may be controlled such that power is supplied only to the PMU 13, the register 14, and the like and not to the other components.

Note that the power supply 16 may have another function, or may lack part of the function, for example. Therefore, the power supply 16 may be referred to simply as a circuit, or may be referred to as a first circuit, a second circuit, or the like.

<Operation Example of Semiconductor Device>

Next, an operation example of the semiconductor device 10 illustrated in FIG. 1 will be described using a flowchart in FIG. 2.

Figure 2:
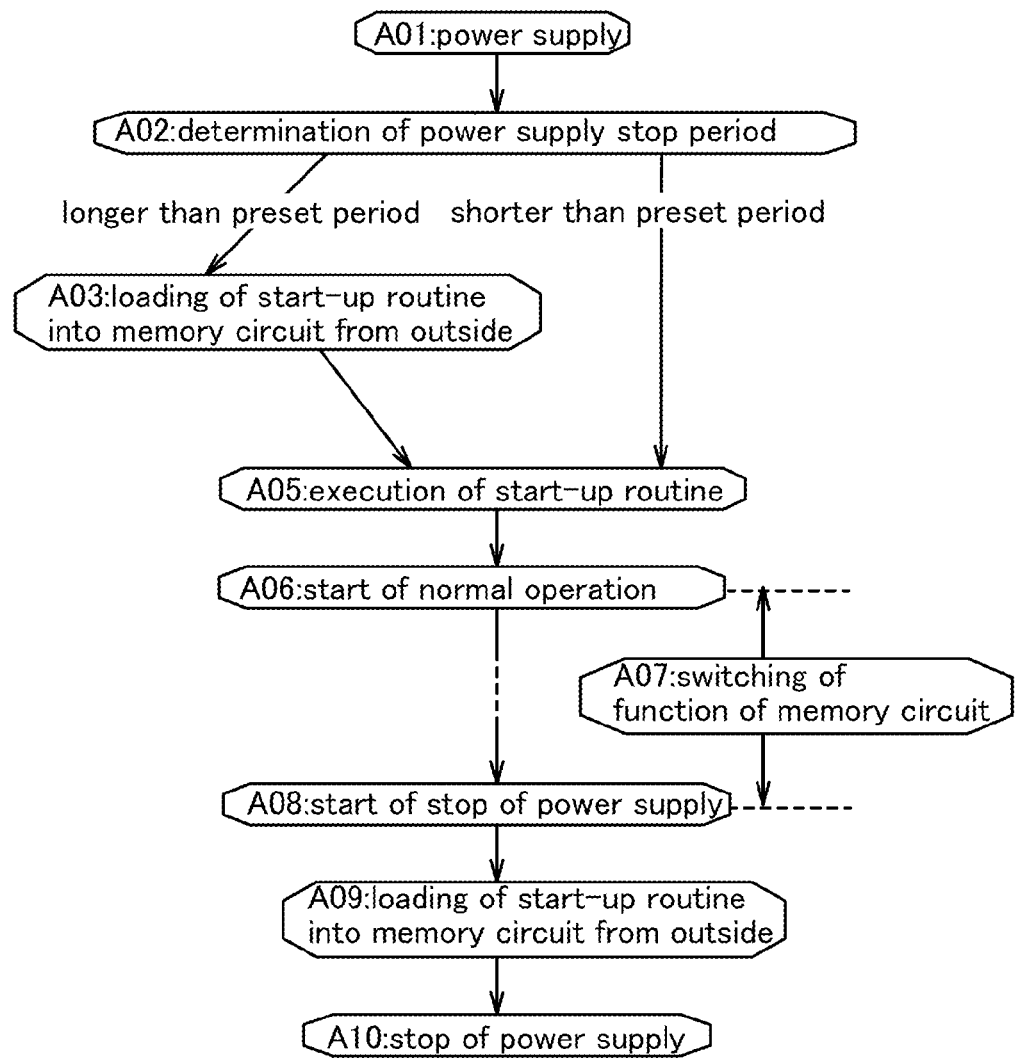
FIG. 2 is a flowchart illustrating the flow of operation of a semiconductor device.

First, as shown in FIG. 2, the supply of power to the semiconductor device 10 is started (A01: power supply). When the supply of power to the semiconductor device 10 is started, the PMU 13 operates to start the supply of power to the processor 11 and the memory circuit 12. The PMU 13 may operate to start the supply of a drive signal to the processor 11 and the memory circuit 12.

Next, the PMU 13 determines whether a period where the supply of power to the semiconductor device 10 is stopped is longer than or shorter than a preset period (A02: determination of power supply stop period). The preset period is preferably set so as to be as long as or shorter than a period where the start-up routine stored in the memory circuit 12 can be retained therein after the supply of power to the memory circuit 12 is stopped.

In the case where the period where the supply of power to the semiconductor device 10 is stopped is longer than the preset period, it is highly likely that the start-up routine is not stored in the memory circuit 12. Therefore, the PMU 13 operates to load the start-up routine into the memory circuit 12 from the outside of the semiconductor device 10 (A03: loading of start-up routine into memory circuit from outside).

In the case where the period where the supply of power to the semiconductor device 10 is stopped is shorter than the preset period, it is highly likely that the start-up routine is stored in the memory circuit 12. Therefore, the PMU 13 operates so that the processor 11 executes the start-up routine stored in the memory circuit 12.

Note that, for example, in the case where the period where the supply of power is stopped can be accurately estimated, whether to load the start-up routine into the memory circuit 12 from the outside of the semiconductor device 10 after the supply of power is resumed can be predetermined before the supply of power is stopped. In that case, data for determining whether to load the start-up routine into the memory circuit 12 from outside (hereinafter referred to as determination data) may be stored in the register 14. With the use of the determination data, it is possible to predetermine whether to load the start-up routine into the memory circuit 12 from the outside of the semiconductor device 10, without determining whether the period where the supply of power to the semiconductor device 10 is stopped is longer than or shorter than the preset period (A02: determination of power supply stop period). Specifically, the PMU 13 can operate, according to the determination data from the register 14, to perform the operation of loading the start-up routine into the memory circuit 12 from the outside of the semiconductor device 10 (A03: loading of start-up routine into memory circuit from outside).

Even in the case where the determination data is stored in the register 14, when the period where the supply of power to the semiconductor device 10 is stopped is longer than the preset period, it is more likely that the start-up routine is not stored in the memory circuit 12. In this case, a valid bit which indicates whether the determination data is valid or invalid may be stored in the memory circuit 12; when the valid bit is invalid, the operation of loading the start-up routine into the memory circuit 12 (A03: loading of start-up routine into memory circuit from outside) is forcibly selected. For example, in the case where a valid bit having a logical value of "1" which indicates that the valid bit is valid, as well as the determination data, is stored in the memory circuit 12, when the determination data is lost, the logical value of the valid bit changes from the logical value "1" which indicates that the valid bit is valid to a logical value of "0" which indicates that it is invalid, whereby the determination data can be determined to be invalid.

Next, the processor 11 executes the start-up routine (A05: execution of start-up routine). By executing the start-up routine, the processor 11 is booted, i.e., becomes capable of executing a variety of programs.

Next, the semiconductor device 10 starts normal operation (A06: start of normal operation). In one embodiment of the present invention, after the semiconductor device 10 starts normal operation, the function of the memory circuit 12 can be switched (A07: switching of function of memory circuit). Specifically, after the semiconductor device 10 starts normal operation, the memory circuit 12 can function as a buffer memory device of the processor 11. Then, when the stop of the supply of power to the semiconductor device 10 is started (A08: start of stop of power supply), the function of the memory circuit 12 is switched to the original function of storing the start-up routine.

Figure 3:
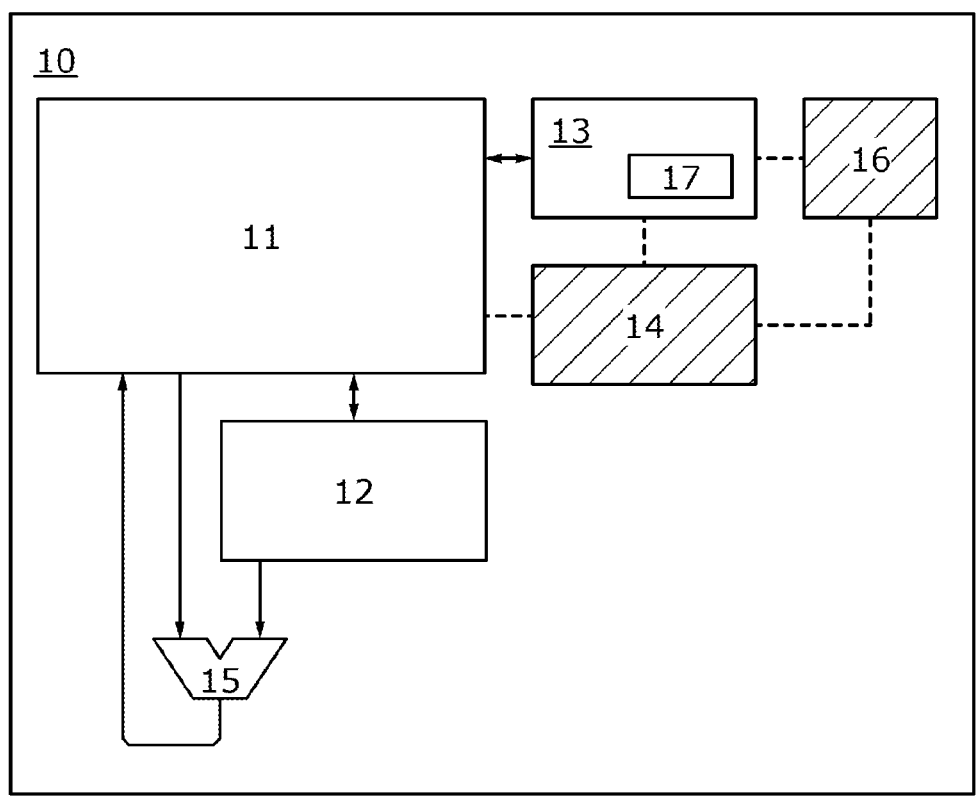
FIG. 3 illustrates an operation of a semiconductor device.

FIG. 3 schematically illustrates an operation of the semiconductor device 10 in which the memory circuit 12 functions as the buffer memory device of the processor 11. As illustrated in FIG. 3, in the semiconductor device 10, the processor 11, the memory circuit 12, the comparator circuit 15, and the PMU 13 are in an operating state, i.e., in a state of being supplied with power and a drive signal. In the case where the counter 17 is separate from the PMU 13 in the semiconductor device 10, the counter 17 is not necessarily in the operating state. In the case where the memory circuit 12 functions as the buffer memory device of the processor 11, power is supplied to the semiconductor device 10 from outside; therefore, power is not necessarily supplied from the power supply 16 to the PMU 13 and the register 14.

For example, when the processor 11 requests access to data in the memory circuit 12, low-order and high-order bits of an address of the data are sent to the memory circuit 12 and the comparator circuit 15, respectively. The memory circuit 12 sends, to the comparator circuit 15, high-order bits (also referred to as tag data) of an address stored in a line corresponding to the low-order bits of the address to which access is requested. The comparator circuit 15 compares the high-order bits of the address to which access is requested by the processor 11 with the high-order bits of the address sent from the memory circuit 12. As a result of comparison, when the high-order bits of the addresses match with each other, the data is stored in the line corresponding to the low-order bits of the address to which access is requested by the processor 11. When the high-order bits of the addresses do not match with each other, the data to which access is requested is not stored in the memory circuit 12. In the case where the data is stored in the memory circuit 12, the data is sent to the processor 11.

Next, the start-up routine is loaded from the outside of the semiconductor device 10 and stored in the memory circuit 12 (A09: loading of start-up routine into memory circuit from outside). Then, the supply of power to the semiconductor device 10 is stopped (A10: stop of power supply).

In the case where the start-up routine is stored in the memory circuit 12 before the supply of power is stopped, the start-up routine does not need to be loaded into the memory circuit 12 from outside when the supply of power to the semiconductor device 10 is resumed (A01: power supply) and the period where the supply of power is stopped is determined (A02: determination of power supply stop period) to be shorter than the preset period. This can reduce the time it takes to boot the processor 11.

Figure 4:
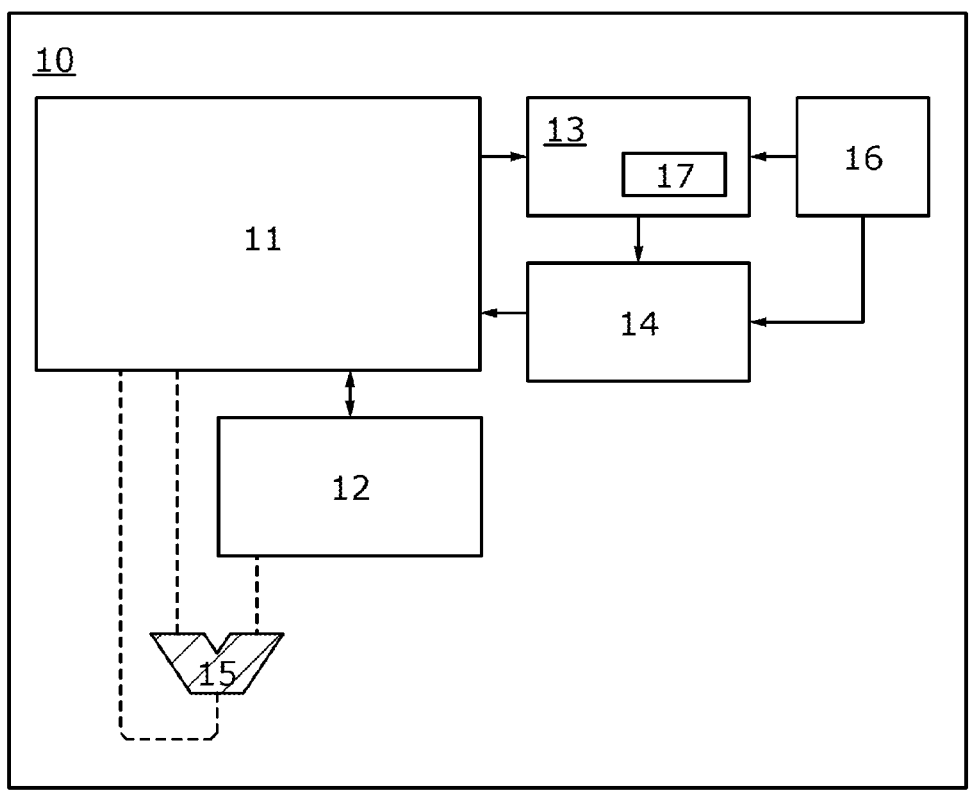
FIG. 4 illustrates an operation of a semiconductor device.

FIG. 4 schematically illustrates an operation of the semiconductor device 10 in which the memory circuit 12 has a function of storing the start-up routine. As illustrated in FIG. 4, in the semiconductor device 10, the processor 11, the memory circuit 12, the PMU 13, and the register 14 are in an operating state. In the case where the counter 17 is separate from the PMU 13 in the semiconductor device 10, the counter 17 is also in the operating state. In the case where the memory circuit 12 has a function of storing the start-up routine, power is supplied to the semiconductor device 10 from outside in some cases and not in others. In the case where power is supplied to the semiconductor device 10, power is not necessarily supplied from the power supply 16 to the PMU 13 and the register 14. In the case where power is not supplied to the semiconductor device 10, power is supplied from the power supply 16 to the PMU 13 and the register 14.

Note that in the case where whether to load the start-up routine from outside is predetermined according to the determination data after the supply of power to the semiconductor device 10 is resumed (A01: power supply), the determination data is stored in the register 14 after the stop of the supply of power to the semiconductor device 10 is started (A08: start of stop of power supply) and before the supply of power to the semiconductor device 10 is stopped (A10: stop of power supply).

The determination data may be created according to an instruction that is input to the semiconductor device 10 by a user via an input device of the semiconductor device 10. As the input device, a keyboard, a pointing device, a touch panel, a sensor, or the like can be used.

In the case where a power storage device is used as the power supply 16, power may be supplied to the power storage device in a period where power is supplied to the semiconductor device 10.

<Structural Example 2 of Semiconductor Device>

Figure 5:
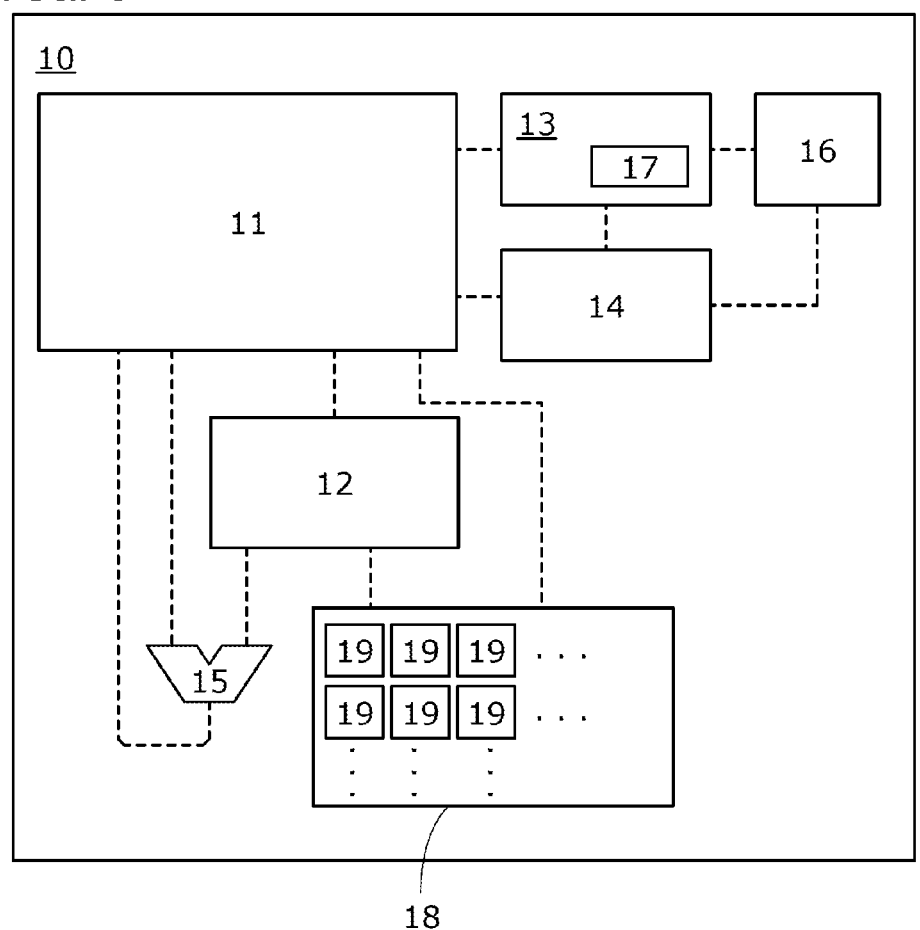
FIG. 5 illustrates a structure of a semiconductor device.

Next, a structural example of a semiconductor device of one embodiment of the present invention, which is different from that in FIG. 1, will be described. FIG. 5 illustrates a structure of a semiconductor device 10 of one embodiment of the present invention.

Like the semiconductor device 10 in FIG. 1, the semiconductor device 10 in FIG. 5 includes a processor 11, a memory circuit 12, a power management unit (PMU) 13, a register 14, a comparator circuit 15, and a power supply 16. In addition, the semiconductor device 10 in FIG. 5 includes a logic circuit 18, and the logic circuit 18 includes a plurality of circuits 19.

In the semiconductor device 10 in FIG. 5, as in the semiconductor device 10 in FIG. 1, the memory circuit 12 can store data on a start-up routine to be executed when the processor 11 is booted. In the semiconductor device 10 in FIG. 5, as in the semiconductor device 10 in FIG. 1, the memory circuit 12 can function as a buffer memory device of the processor 11 after the processor 11 is booted. Furthermore, in the semiconductor device 10 in FIG. 5, the memory circuit 12 can store data for controlling electrical connection between the plurality of circuits 19 (hereinafter referred to as configuration data). By controlling electrical connection between the plurality of circuits 19 according to the configuration data stored in the memory circuit 12, the logic circuit 18 can have additional functions of a variety of sequential circuits and combination circuits.

The semiconductor device 10 in FIG. 5 may have a structure with which the kind of logic operation of the circuit 19, specifically, the logical value of an output signal corresponding to the logical value of an input signal of the circuit 19, is determined according to configuration data. When the kind of logic operation of each of the plurality of circuits 19 is changed, the logic circuit 18 can have additional functions of a greater variety of sequential circuits and combination circuits.

In the semiconductor device 10 in FIG. 5, the memory circuit 12 may have a function of a switch for controlling electrical connection between the plurality of circuits 19 according to the configuration data, in addition to the function of storing the configuration data.

Figure 6:
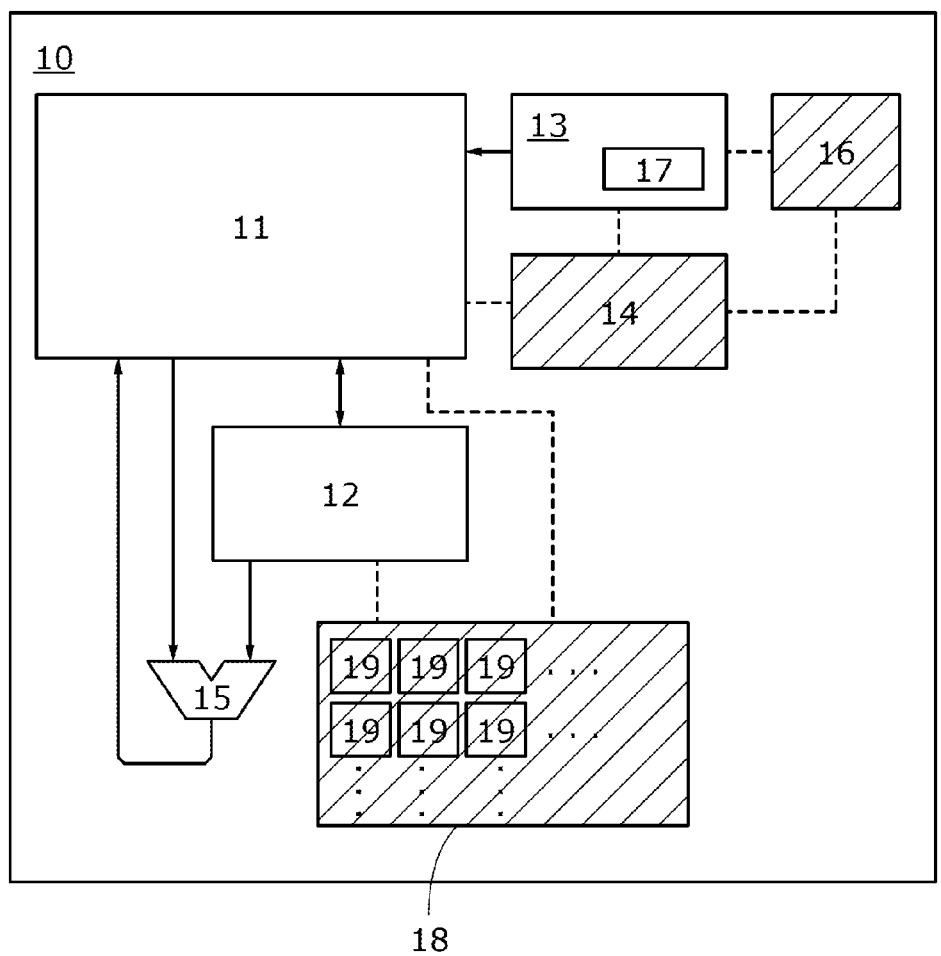
FIG. 6 illustrates an operation of a semiconductor device.

FIG. 6 schematically illustrates an operation of the semiconductor device 10 in FIG. 5 in which the memory circuit 12 functions as the buffer memory device of the processor 11. As illustrated in FIG. 6, in the semiconductor device 10, the processor 11, the memory circuit 12, the comparator circuit 15, and the PMU 13 are in an operating state. In the case where the counter 17 is separate from the PMU 13 in the semiconductor device 10, the counter 17 is not necessarily in the operating state. In the case where the memory circuit 12 functions as the buffer memory device of the processor 11, power is supplied to the semiconductor device 10 from outside; therefore, power is not necessarily supplied from the power supply 16 to the PMU 13 and the register 14.

Figure 7:
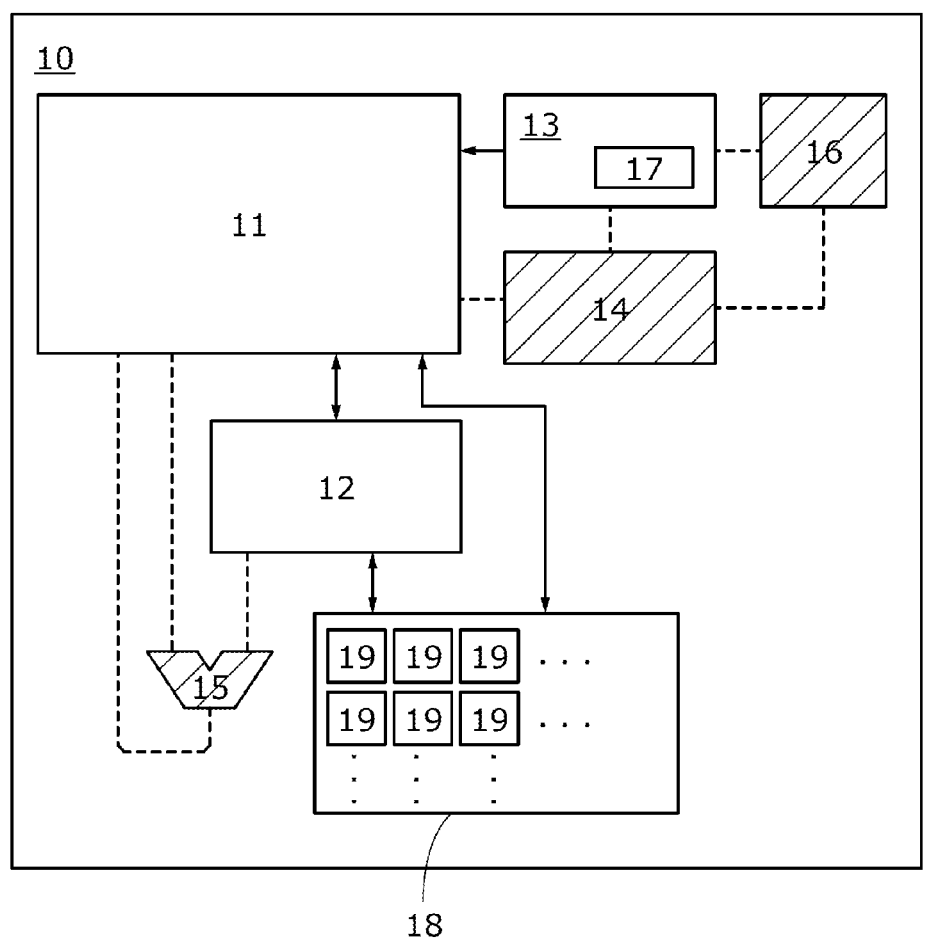
FIG. 7 illustrates an operation of a semiconductor device.

FIG. 7 schematically illustrates an operation of the semiconductor device 10 in FIG. 5 in which the memory circuit 12 has a function of storing the configuration data. As illustrated in FIG. 7, in the semiconductor device 10, the processor 11, the memory circuit 12, the PMU 13, and the logic circuit 18 are in an operating state. In the case where the counter 17 is separate from the PMU 13 in the semiconductor device 10, the counter 17 is not necessarily in the operating state. In the case where the memory circuit 12 has a function of storing the configuration data, power is supplied to the semiconductor device 10 from outside; therefore, power is not necessarily supplied from the power supply 16 to the PMU 13 and the register 14.

Figure 8:
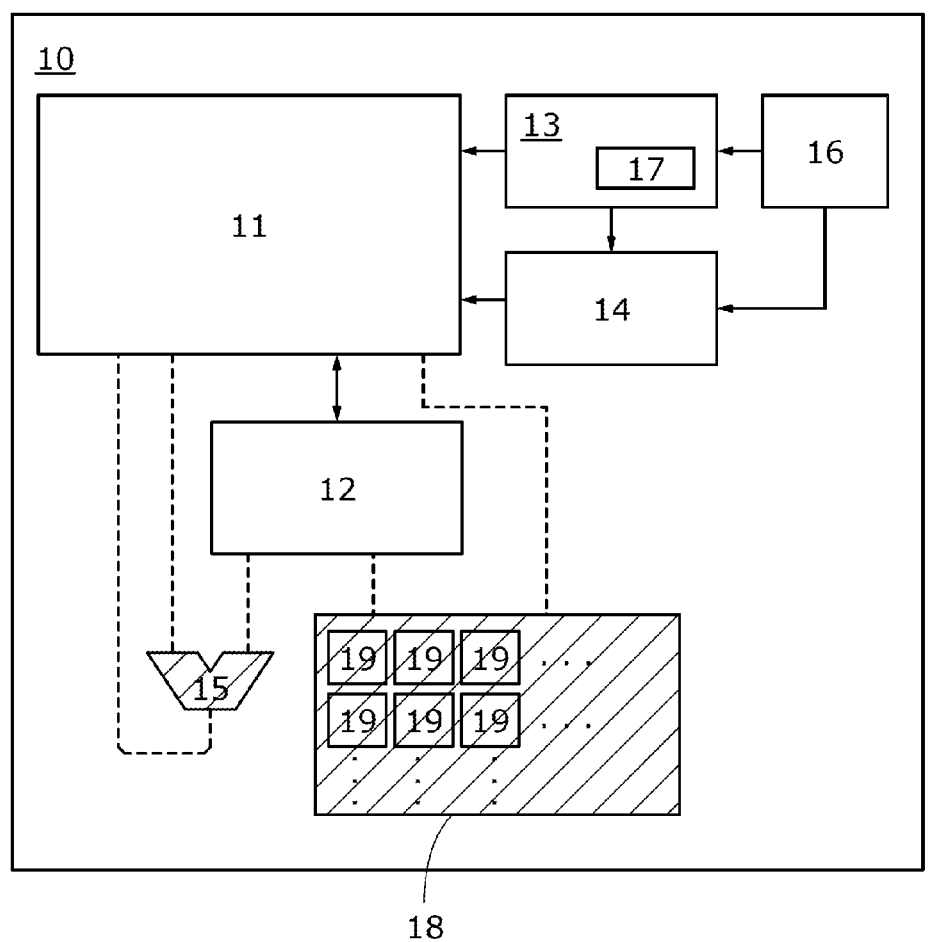
FIG. 8 illustrates an operation of a semiconductor device.

FIG. 8 schematically illustrates an operation of the semiconductor device 10 in FIG. 5 in which the memory circuit 12 has a function of storing the start-up routine.

As illustrated in FIG. 8, in the semiconductor device 10, the processor 11, the memory circuit 12, the PMU 13, and the register 14 are in an operating state. In the case where the counter 17 is separate from the PMU 13 in the semiconductor device 10, the counter 17 is also in the operating state. In the case where the memory circuit 12 has a function of storing the start-up routine, power is supplied to the semiconductor device 10 from outside in some cases and not in others. In the case where power is supplied to the semiconductor device 10, power is not necessarily supplied from the power supply 16 to the PMU 13 and the register 14. In the case where power is not supplied to the semiconductor device 10, power is supplied from the power supply 16 to the PMU 13 and the register 14.

Note that FIGS. 6 and 7 schematically illustrate operations in which the memory circuit 12 functions as the buffer memory device of the processor 11 and in which the memory circuit 12 has a function of storing the configuration data, respectively. However, in one embodiment of the present invention, a portion of the memory circuit 12 may function as the buffer memory device of the processor 11, and another portion of the memory circuit 12 may have a function of storing the configuration data.

<Structural Example of Cell Array>

Next, a specific structural example of a cell array 20 included in the memory circuit 12 will be described.

Figure 9:
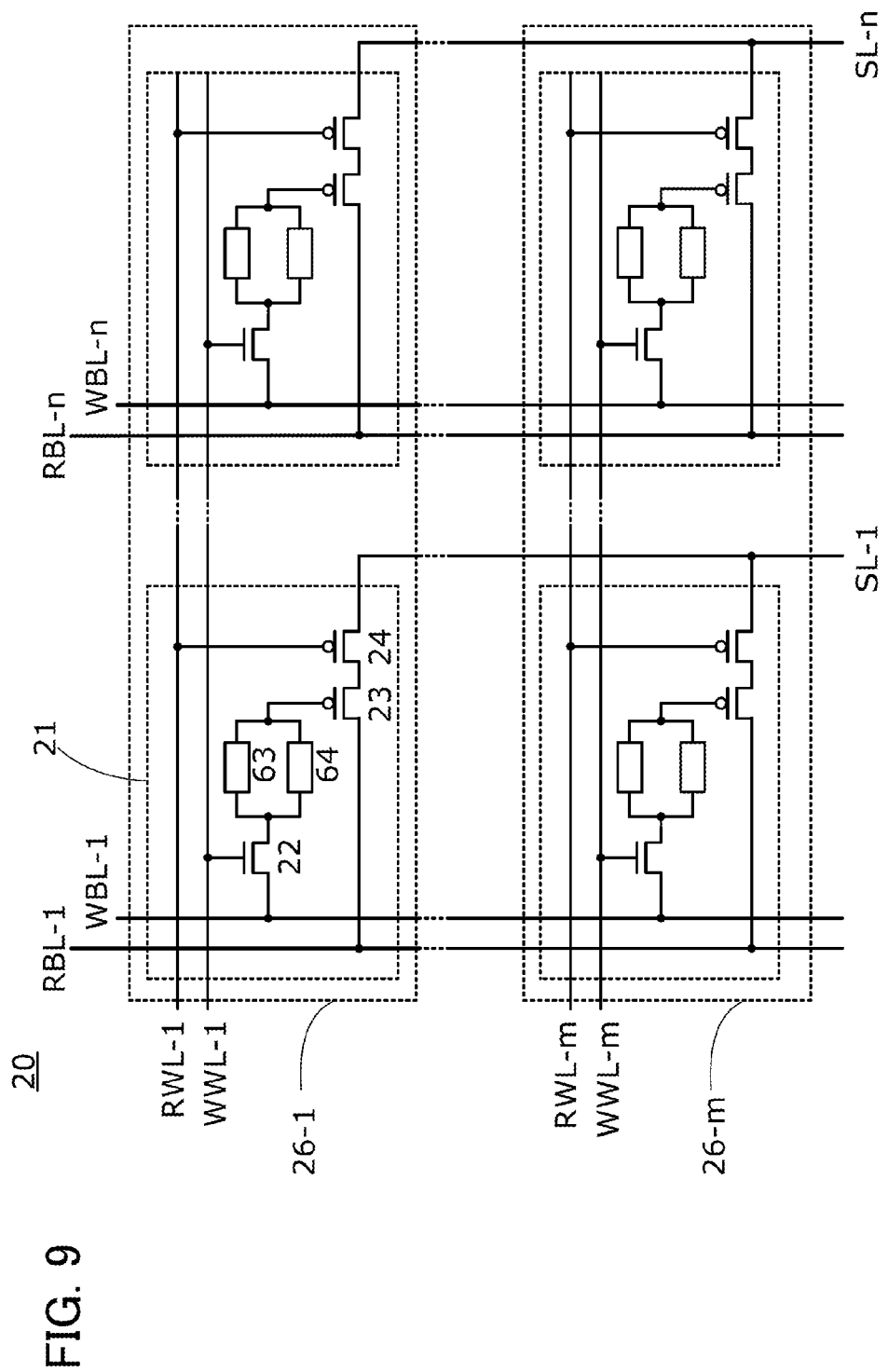
FIG. 9 illustrates a structural example of a cell array.

The cell array 20 illustrated in FIG. 9 includes a plurality of wirings WBL represented as wirings WBL-1 to WBL-n (n is a natural number greater than or equal to 2), a plurality of wirings RBL represented as wirings RBL-1 to RBL-n, a plurality of wirings SL represented as wirings SL-1 to SL-n, a plurality of wirings WWL represented as wirings WWL-1 to WWL-m (m is a natural number greater than or equal to 2), and a plurality of wirings RWL represented as wirings RWL-1 to RWL-m. The cell array 20 illustrated in FIG. 9 also includes (n×m) circuits 21. Each of the circuits 21 at least includes a transistor 22, a transistor 23, a transistor 24, a circuit 63, and a circuit 64. The circuits 63 and 64 have a function of retaining the potential of a gate of the transistor 23.

The circuits 63 and 64 have a function of inverting the polarity of a potential, for example. Inverters or the like can be used, for example. Specifically, in FIG. 9, an input terminal of the circuit 63 and an output terminal of the circuit 64 are electrically connected to each other. An output terminal of the circuit 63 and an input terminal of the circuit 64 are electrically connected to each other. The gate of the transistor 23 is electrically connected to the output terminal of the circuit 63. Since each of the circuits 21 illustrated in FIG. 9 has the above structure, the potential of the gate of the transistor 23 can be retained by the circuits 63 and 64.

The (n×m) circuits 21 are divided into m groups 26, each of which is connected to a wiring WWL-j and a wiring RWL-j (j is a natural number less than m) and includes n circuits 21. In FIG. 9, the m groups 26 are shown as groups 26-1 to 26-m.

Specifically, in the circuit 21 in the j-th row and the i-th column (i is a natural number less than n), a gate of the transistor 22 is electrically connected to the wiring WWL-j. One of a source and a drain of the transistor 22 is electrically connected to a wiring WBL-i and the other is electrically connected to the input terminal of the circuit 63. The gate of the transistor 23 is electrically connected to the output terminal of the circuit 63. One of a source and a drain of the transistor 23 is electrically connected to a wiring RBL-i and the other is electrically connected to one of a source and a drain of the transistor 24. The other of the source and the drain of the transistor 24 is electrically connected to a wiring SL-i. A gate of the transistor 24 is electrically connected to the wiring RWL-j.

Figure 12:
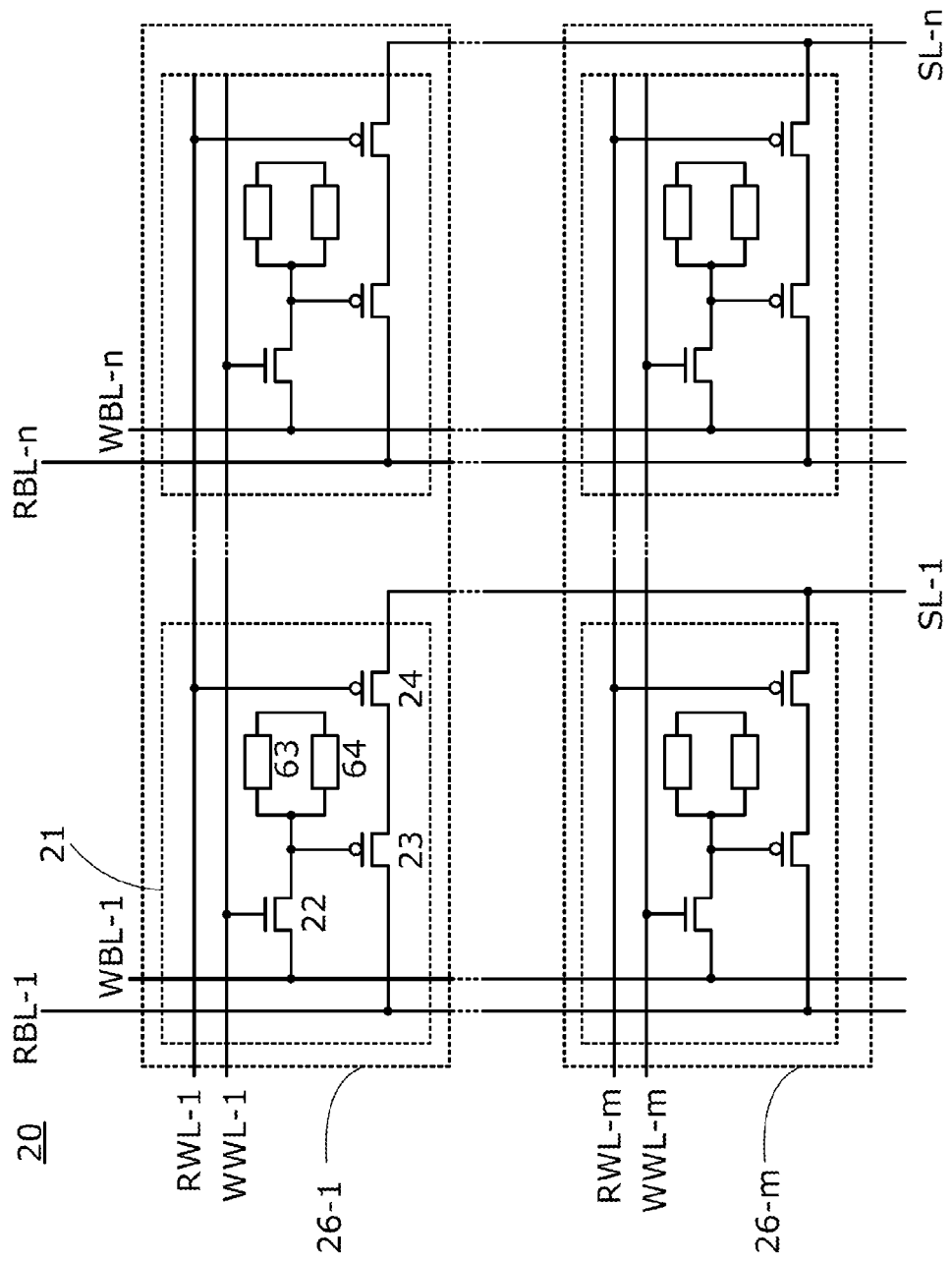
FIG. 12 illustrates a structural example of a cell array.

Note that the gate of the transistor 23 may be electrically connected to the input terminal of the circuit 63. An example of this case is shown in FIG. 12.

Note that the transistor 23 and the transistor 24 are connected to each other in series. FIG. 9 shows the case where the transistor 24 is electrically connected between the other of the source and the drain of the transistor 23 and the wiring SL. That is, the wiring SL, the transistor 24, the transistor 23, and the wiring RBL are electrically connected in this order. Note that one embodiment of the present invention is not limited thereto. For example, the transistor 24 may be electrically connected between the one of the source and the drain of the transistor 23 and the wiring RBL. That is, the wiring SL, the transistor 23, the transistor 24, and the wiring RBL may be electrically connected in this order.

Each of the circuits 21 may also include another circuit element such as a transistor, a diode, a resistor, a capacitor, an inductor, or the like as necessary.

In each of the circuits 21 included in the cell array 20 illustrated in FIG. 9, when a signal containing data is supplied to the wiring WBL while the transistor 22 is on, the signal is supplied to the gate of the transistor 23 through the transistor 22 and the circuit 63. Then, the transistor 22 is turned off, whereby the signal supplied to the gate of the transistor 23 is retained. The transistor 23 is turned on or off depending on the potential of the gate which retains the signal.

Since the transistor 24 and the transistor 23 are electrically connected to each other in series, the transistor 24 controls the electrical connection (on/off state) between the wiring RBL and the wiring SL, together with the transistor 23. Specifically, when the transistor 23 and the transistor 24 are on, the wiring RBL and the wiring SL are electrically connected to each other, which allows current to flow therebetween. In the case where at least one of the transistors 23 and 24 is off, the wiring RBL and the wiring SL are electrically isolated from each other. This means that the electrical connection between the plurality of wirings RBL and the plurality of wirings SL is determined depending on the potential of the signal containing data stored in each of the circuits 21.

In the case where the memory circuit 12 functions as a buffer memory device, or in the case where the memory circuit 12 has a function of storing configuration data, a predetermined potential such as a ground potential is supplied to the wiring SL, for example. Then, when the transistor 24 is turned on, whether the potential is supplied to the wiring RBL through the transistor 23 and the transistor 24 is determined, whereby data stored in the circuit 21 can be read. In that case, before the data is read, the potential of the wiring RBL is initialized by supplying a potential different from that of the wiring SL to the wiring RBL.

In the case where the memory circuit 12 has a function of storing configuration data and has a function of a switch for controlling electrical connection between the plurality of circuits 19 according to configuration data, the wiring RBL is connected to one of the plurality of circuits 19 illustrated in FIG. 5, and the wiring SL is connected to another one of the plurality of circuits 19. Accordingly, the electrical connection between the circuits 19 is controlled according to the data stored in each of the circuits 21 in the cell array 20.

Next, specific circuit structures of the circuit 63 and the circuit 64 will be described.

Figure 21:
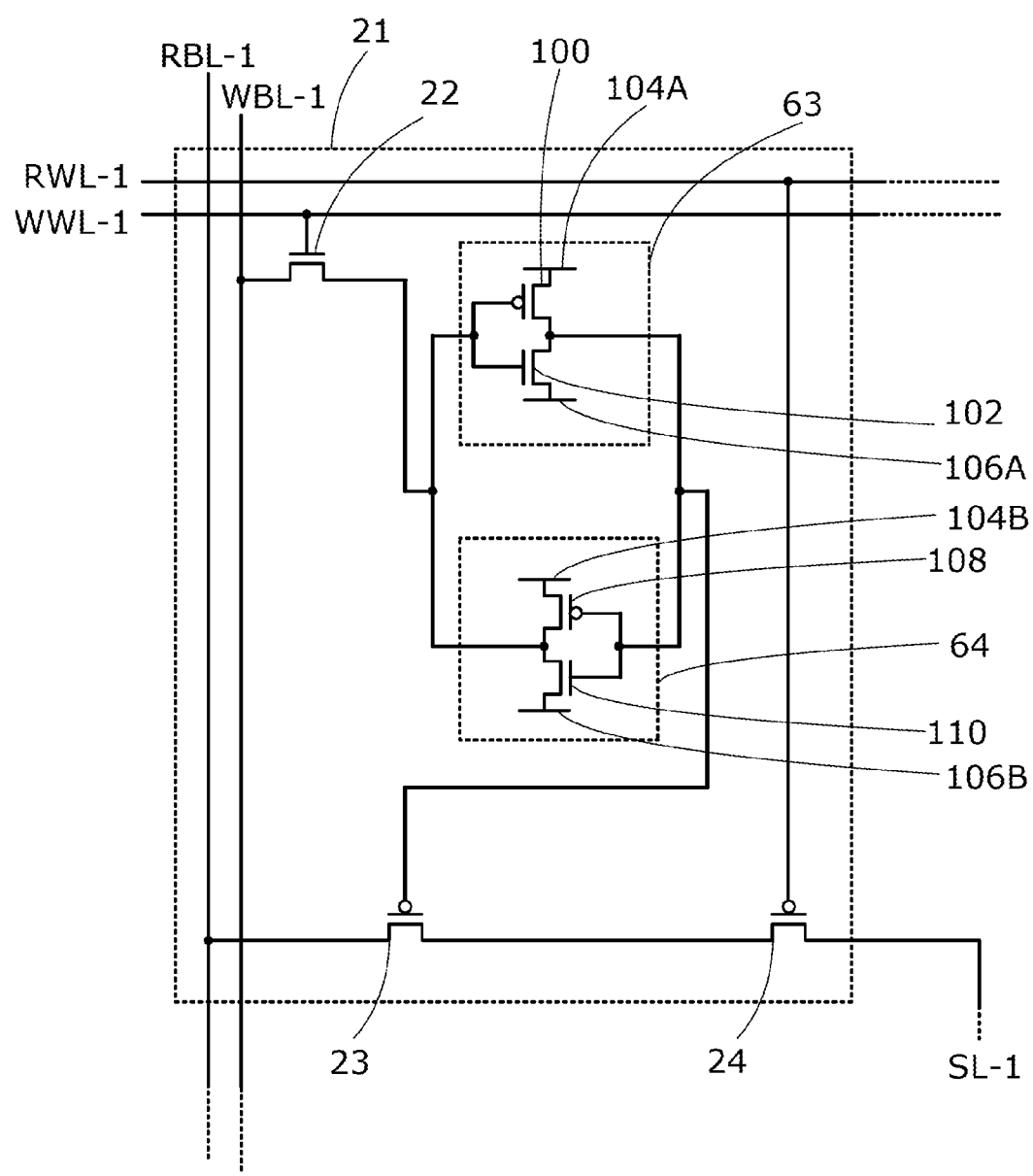
FIG. 21 illustrates a structural example of a cell array.
Figure 22:
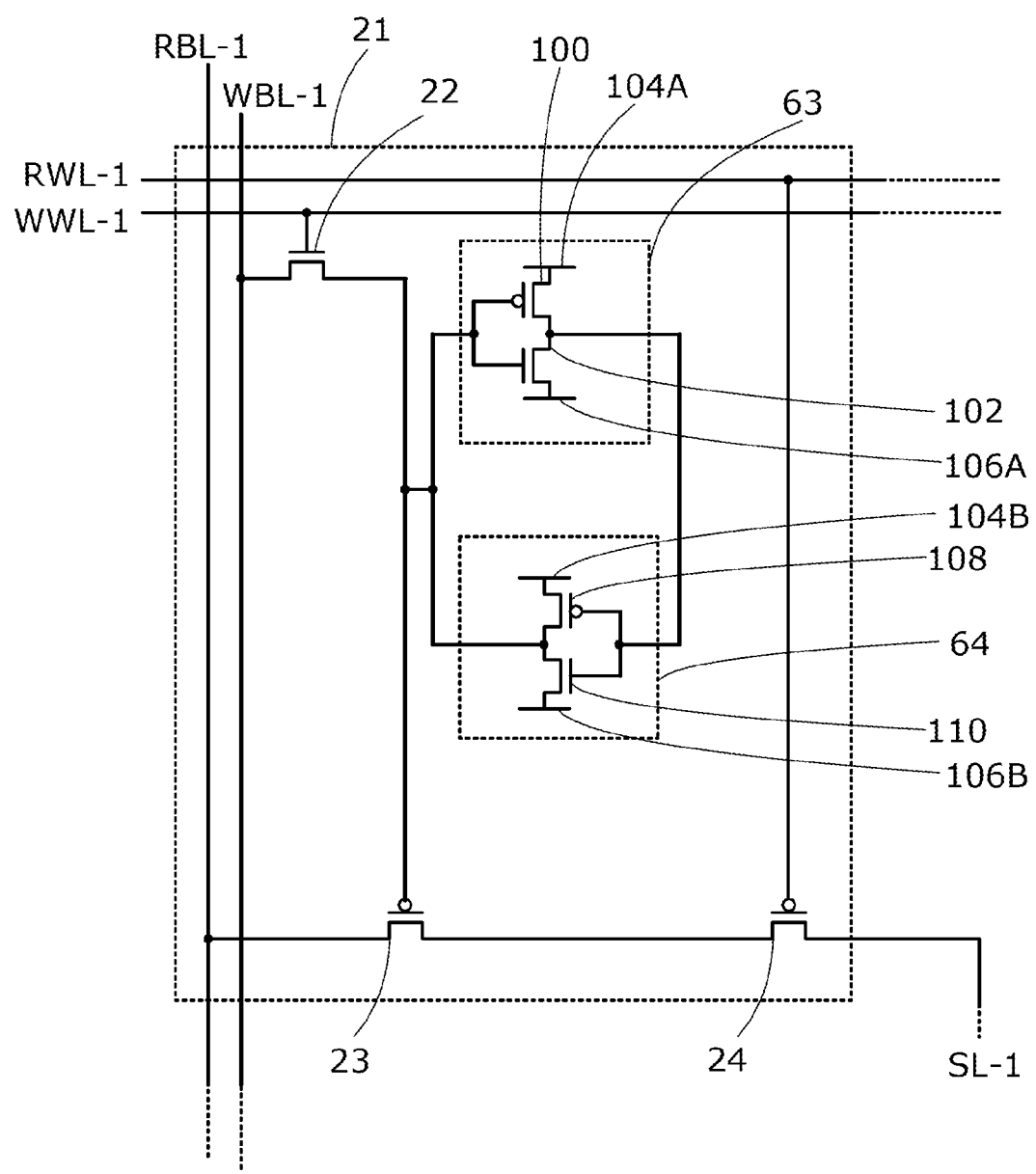
FIG. 22 illustrates a structural example of a cell array.

FIG. 21 illustrates an example in which the circuit 63 and the circuit 64 in FIG. 9 are CMOS inverters. FIG. 22 illustrates an example in which the circuit 63 and the circuit 64 in FIG. 12 are CMOS inverters. The circuit 63 includes a transistor 100 and a transistor 102. For example, the transistor 100 is a p-channel transistor, and the transistor 102 is an n-channel transistor. A source of the transistor 100 is electrically connected to a wiring 104A. A source of the transistor 102 is electrically connected to a wiring 106A. Similarly, the circuit 64 includes a transistor 108 and a transistor 110. For example, the transistor 108 is a p-channel transistor, and the transistor 110 is an n-channel transistor. A source of the transistor 108 is electrically connected to a wiring 104B. A source of the transistor 110 is electrically connected to a wiring 106B.

Figure 23:
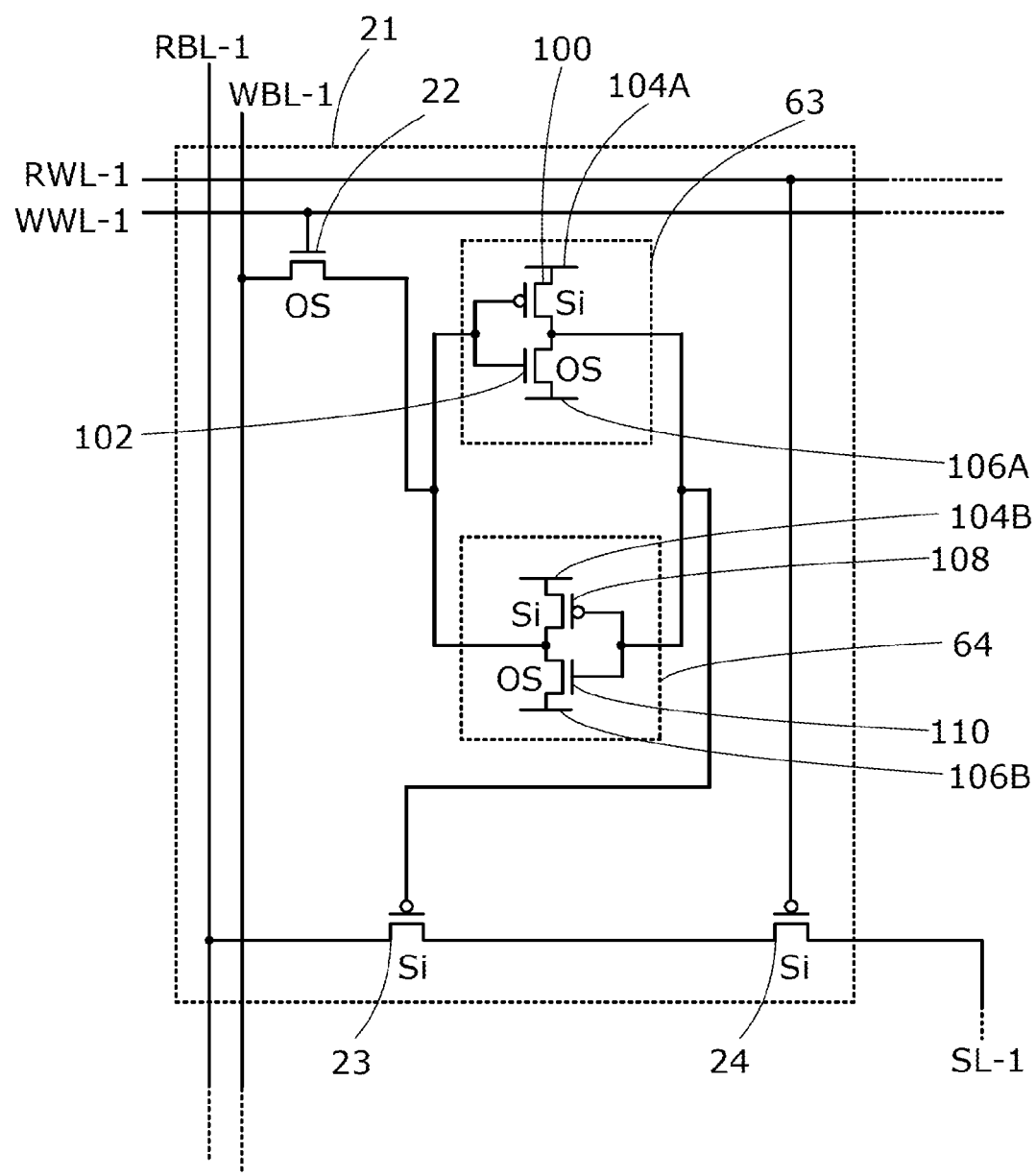
FIG. 23 illustrates a structural example of a cell array
Figure 24:
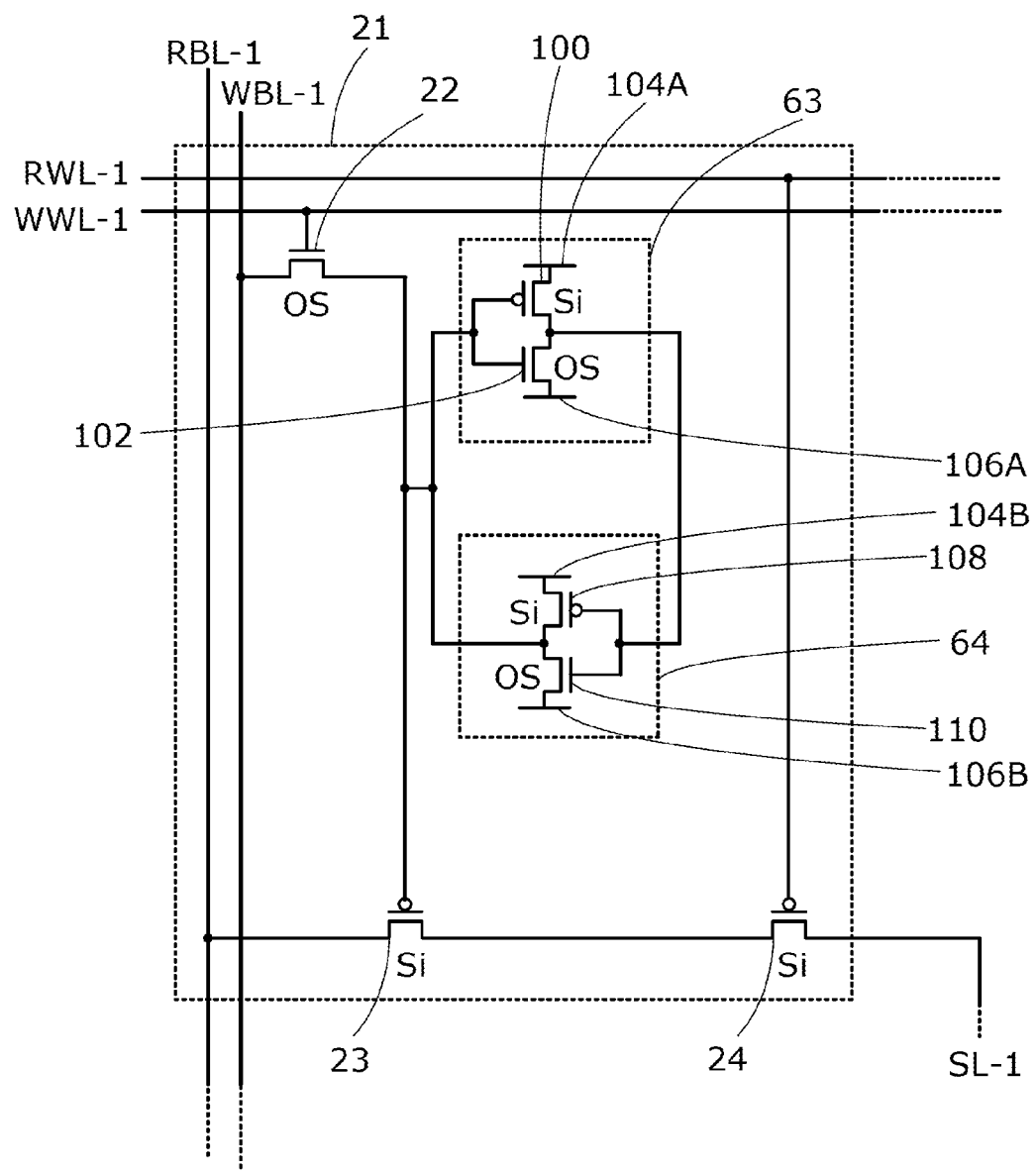
FIG. 24 illustrates a structural example of a cell array.

FIGS. 23 and 24 each illustrate an example where channel portions of the p-channel transistors contain single crystal silicon, single crystal germanium, or single crystal silicon germanium and channel portions of the n-channel transistors contain an oxide semiconductor. Note that channel portions containing single crystal silicon, single crystal germanium, single crystal silicon germanium, or the like are denoted by "Si" in circuit diagrams. Similarly, channel portions containing an oxide semiconductor are denoted by "OS" in circuit diagrams.

The transistor 22, the transistor 102, and the transistor 110 preferably have extremely small off-state current. A transistor in which a channel formation region is formed in a film of a semiconductor having a wider band gap and lower intrinsic carrier density than silicon can have extremely smaller off-state current than a transistor formed using a normal semiconductor such as silicon or germanium and thus is preferably used as the transistor 22, the transistor 102, or the transistor 110. Examples of such a semiconductor are an oxide semiconductor and gallium nitride that each have a band gap more than twice as wide as that of silicon. Consequently, the use of the transistor 22 having the above structure can prevent leakage of electric charge from a signal retained in the circuit 21. Alternatively, since the off-state current of the transistor 102 is small, current which flows from the wiring 104A to the wiring 106A through the transistor 100 and the transistor 102 in a steady state can be decreased. Similarly, since the off-state current of the transistor 110 is small, current which flows from the wiring 104B to the wiring 106B through the transistor 108 and the transistor 110 in a steady state can be decreased.

Channel portions of the transistor 23, the transistor 24, the transistor 100, and the transistor 108 contain single crystal silicon, single crystal germanium, or single crystal silicon germanium. Note that the transistor 23, the transistor 24, the transistor 100, and the transistor 108 all have the same polarity and are p-channel transistors. Therefore, in the case where the transistor 22, the transistor 102, and the transistor 110 are formed using an oxide semiconductor, gallium nitride, or the like, n-channel transistors in the circuit 21 do not exist in the same layer as the transistor 23, the transistor 24, the transistor 100, and the transistor 108. Thus, element isolation between the transistor 23, the transistor 24, the transistor 100, and the transistor 108 or the like is not needed, which enables the transistors to be arranged in a small region.

In the case where channel portions of the transistor 22, the transistor 102, and the transistor 110 contain an oxide semiconductor, the transistor 22, the transistor 102, and the transistor 110 can be stacked over the transistor 23, the transistor 24, the transistor 100, the transistor 108, and the like. Therefore, the circuit 21 can be downsized. The transistor 22, the transistor 102, and the transistor 110 having the same polarity do not require a complicated process and therefore can be manufactured efficiently.

Figure 13:
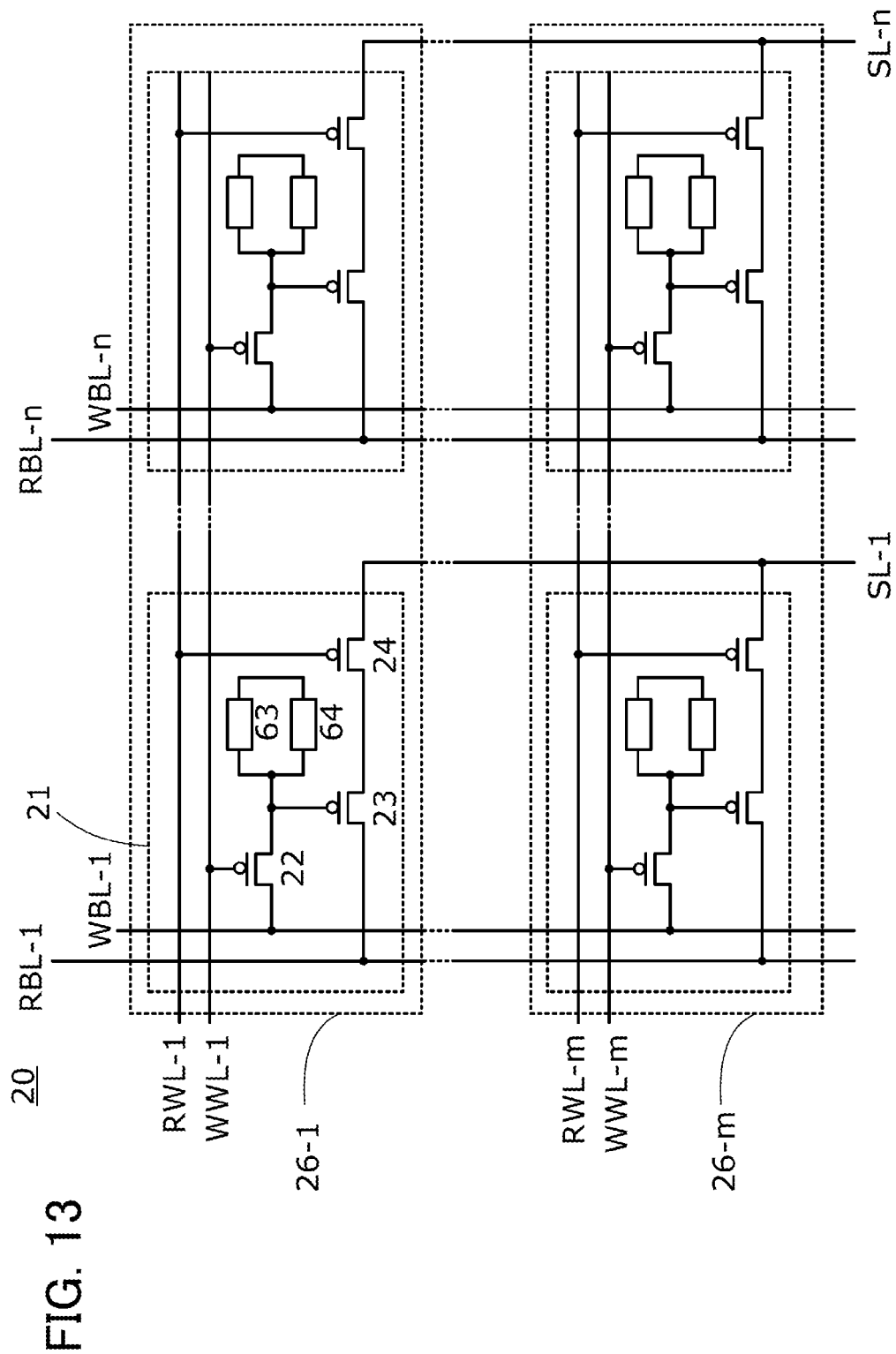
FIG. 13 illustrates a structural example of a cell array
Figure 25:
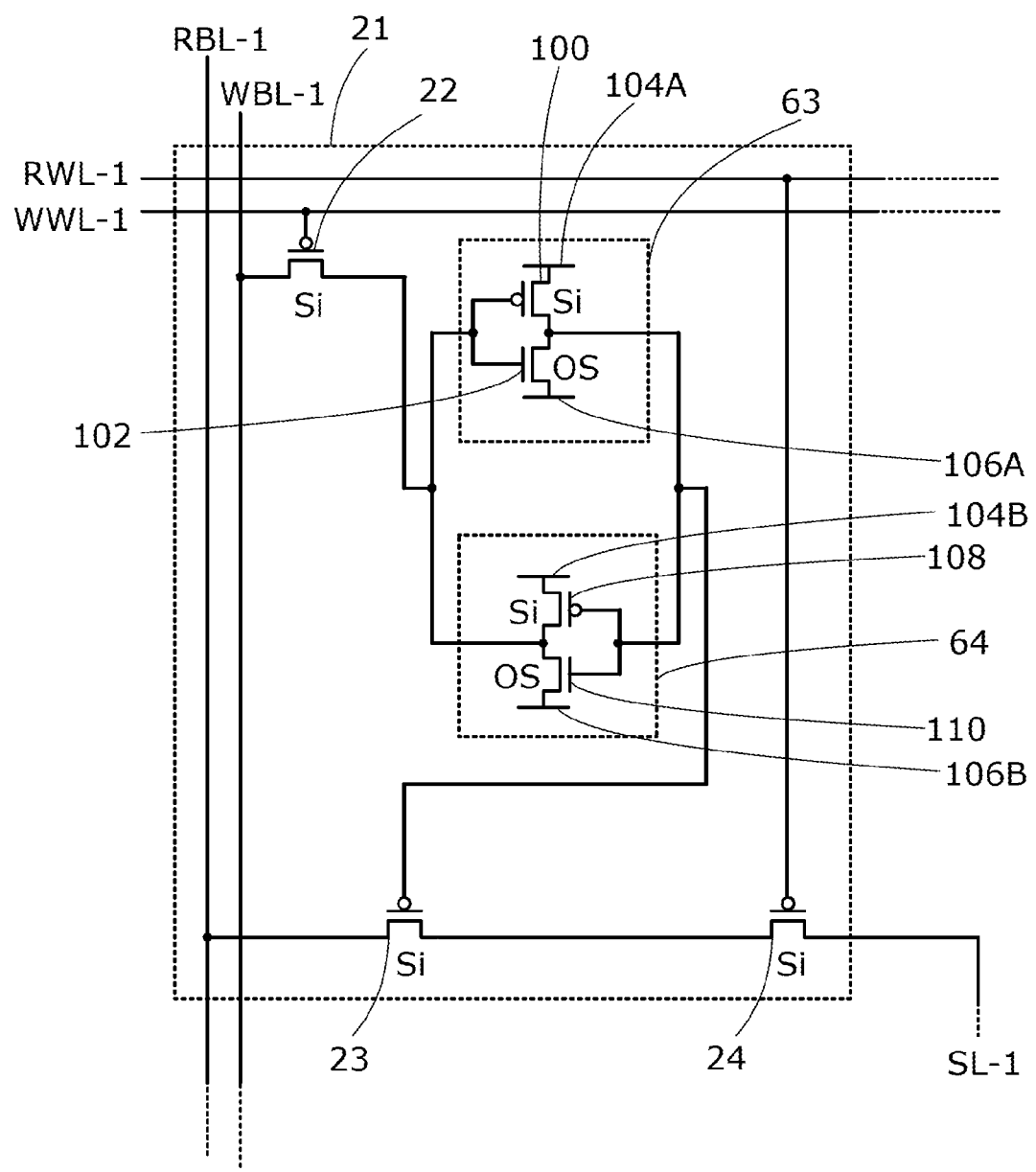
FIG. 25 illustrates a structural example of a cell array.
Figure 26:
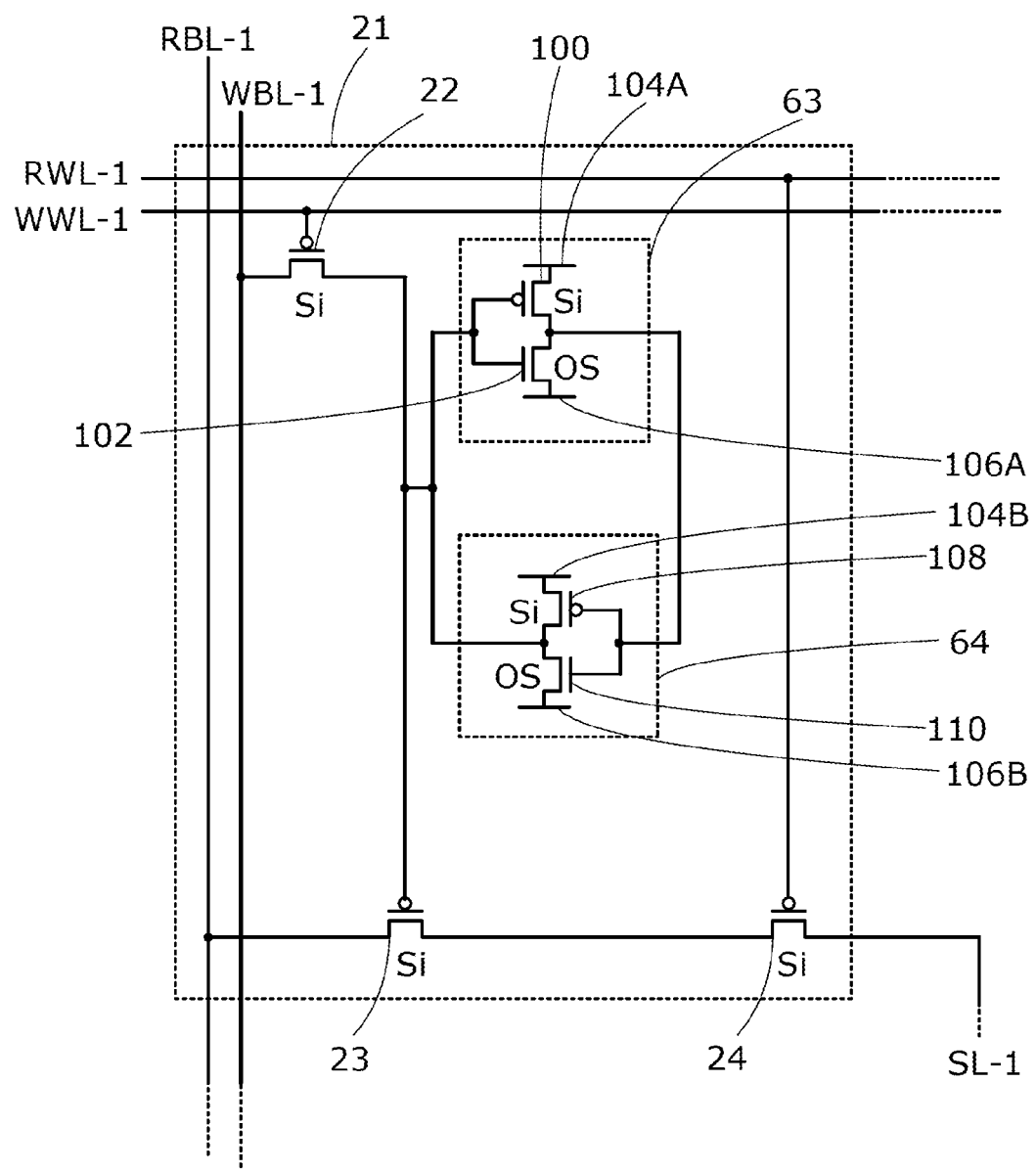
FIG. 26 illustrates a structural example of a cell array.

Note that the transistor 22 may be a p-channel transistor as illustrated in FIG. 13. In that case, the channel portion of the transistor 22 preferably contains single crystal silicon, single crystal germanium, or single crystal silicon germanium. Thus, the transistor 22 can be formed together with the transistor 23, the transistor 24, the transistor 100, and the transistor 108. Examples of this case are shown in FIGS. 25 and 26.

Figure 27:
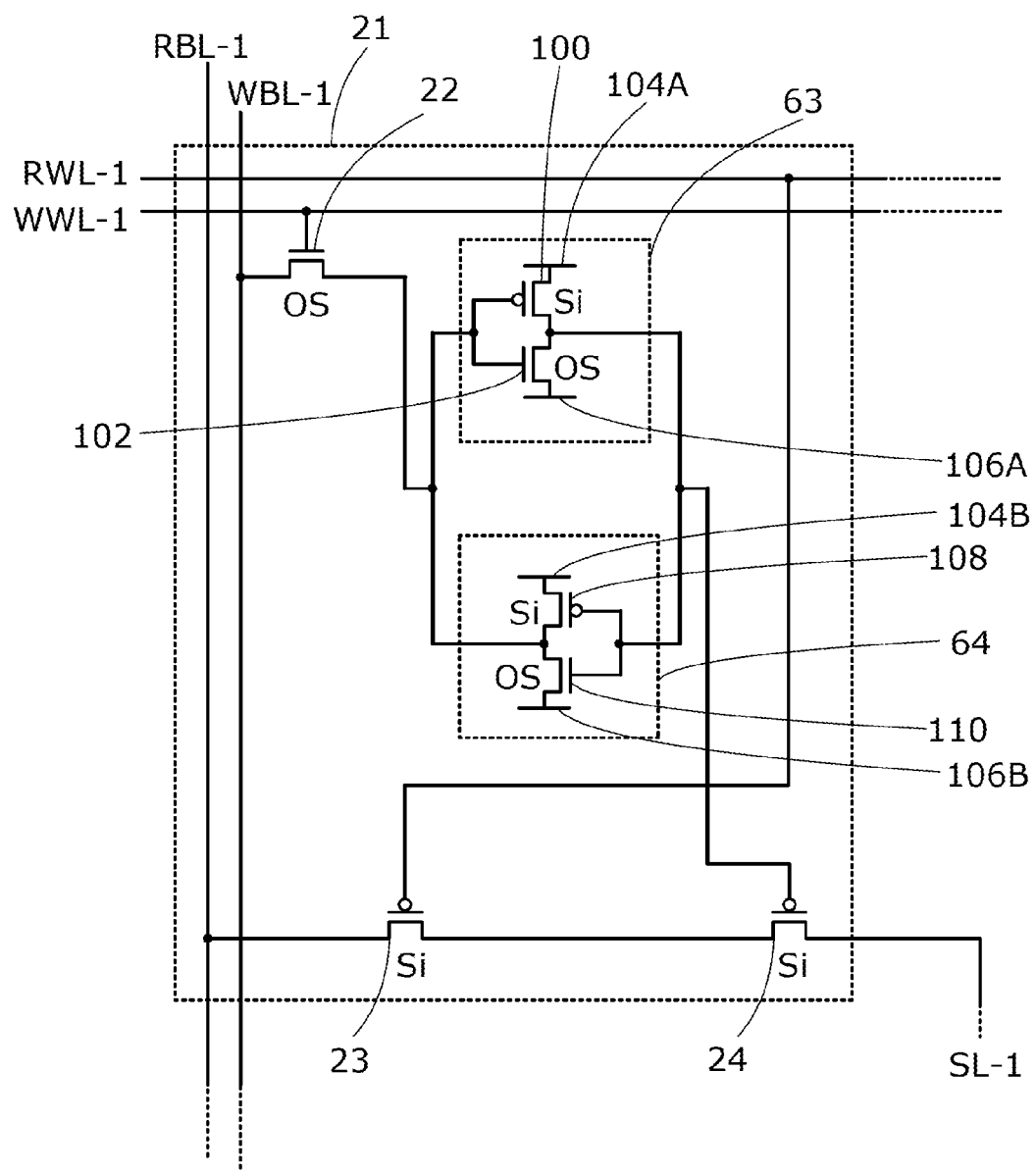
FIG. 27 illustrates a structural example of a cell array.
Figure 28:
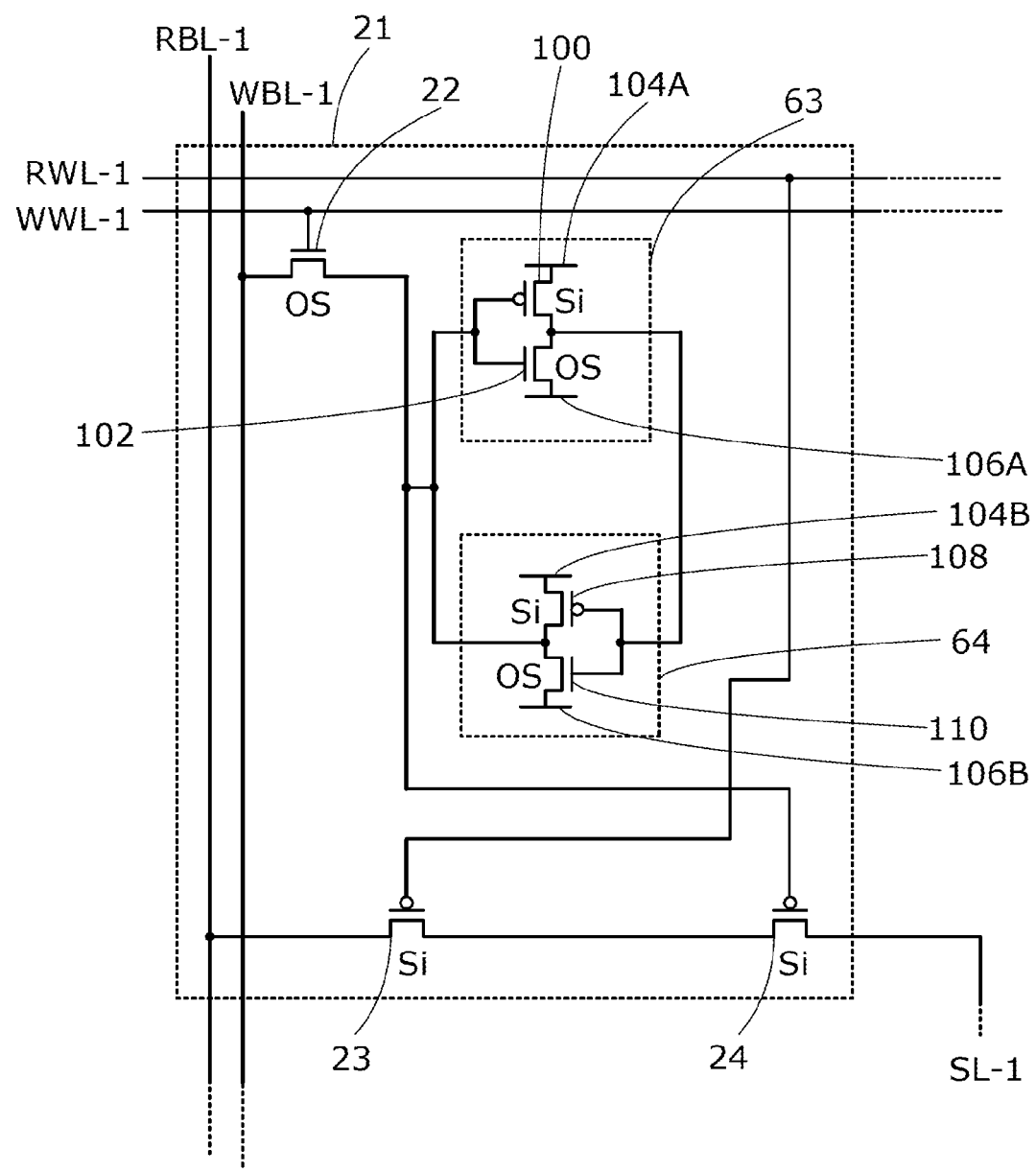
FIG. 28 illustrates a structural example of a cell array

Note that the transistor 23 and the transistor 24 are connected to each other in series. Therefore, connections thereof can be interchanged. Examples of this case are shown in FIGS. 27 and 28. In cases other than those in FIGS. 27 and 28, connections of transistors can be similarly interchanged.

Note that the wiring 104A and the wiring 104B have a function of supplying a high-potential-side power supply voltage, for example. Note that the wiring 104A and the wiring 104B may be provided as separate wirings, or may be a single wiring by being connected to each other.

Figure 29:
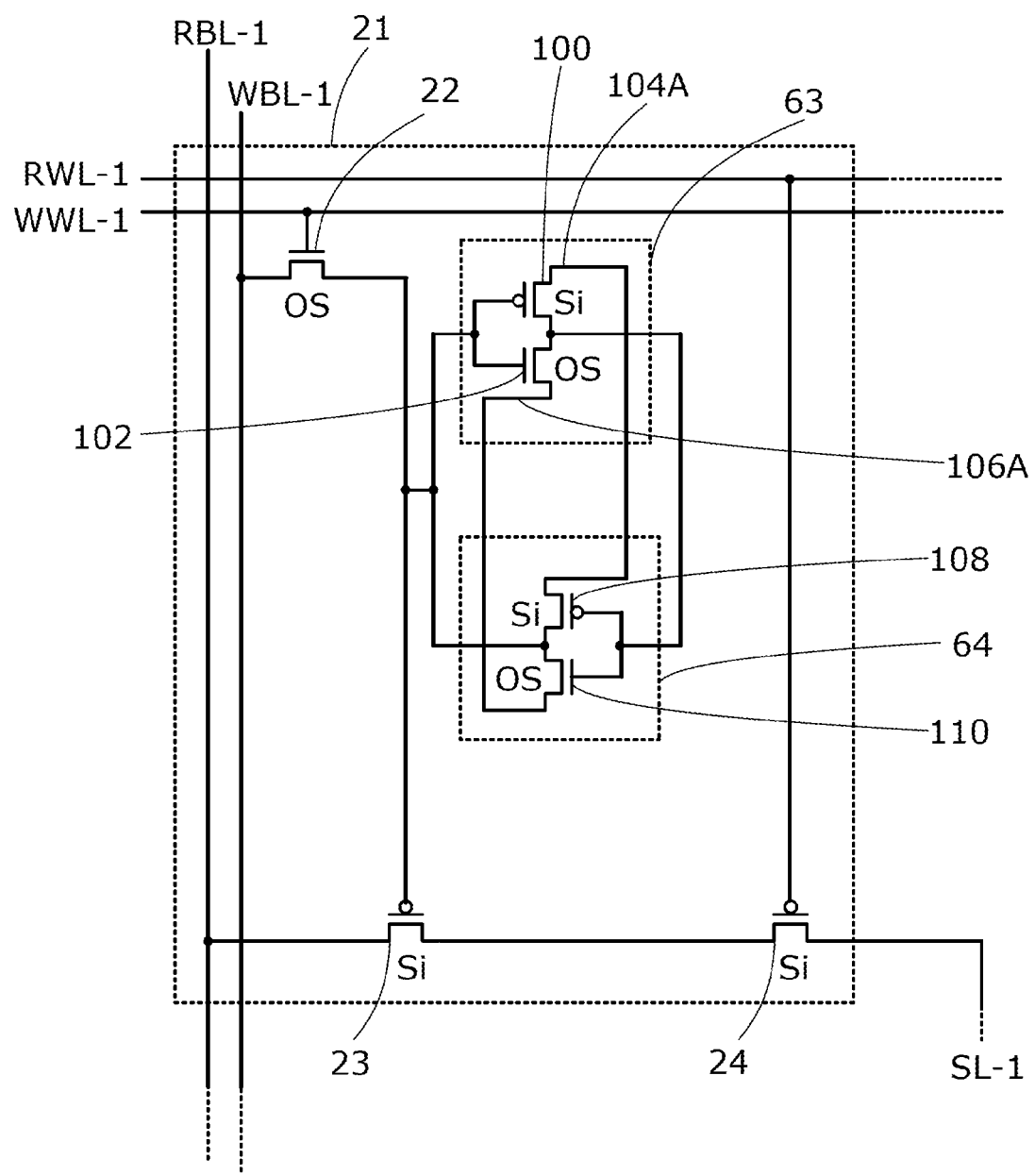
FIG. 29 illustrates a structural example of a cell array.

The wiring 106A and the wiring 106B have a function of supplying a low-potential-side power supply voltage, for example. Note that the wiring 106A and the wiring 106B may be provided as separate wirings, or may be a single wiring by being connected to each other. FIG. 29 illustrates an example where the wirings are combined into one wiring. Note that in cases other than that in FIG. 29, the wiring 104A and the wiring 104B, or the wiring 106A and the wiring 106B, may be similarly combined into one wiring.

Figure 30:
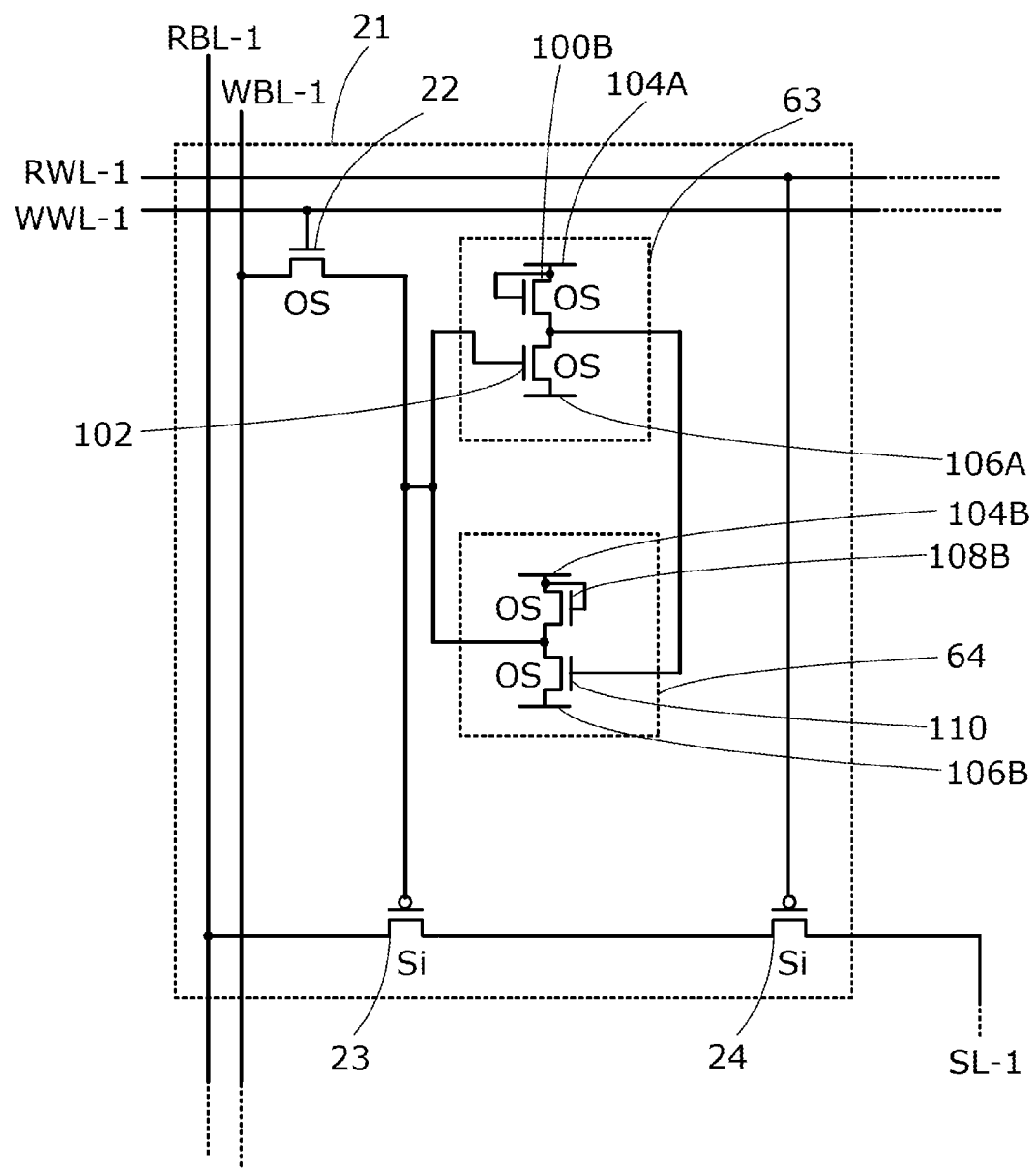
FIG. 30 illustrates a structural example of a cell array.

Although the example where CMOS circuits are used as the circuit 63 and the circuit 64 is given here, one embodiment of the present invention is not limited thereto. The circuit 63 or the circuit 64 may be an NMOS circuit or a PMOS circuit. FIG. 30 illustrates an example where NMOS circuits are used as the circuit 63 and the circuit 64. Note that in cases other than that in FIG. 30, the circuit 63 or the circuit 64 may be similarly an NMOS circuit or a PMOS circuit.

<Structural Example of Memory Circuit>

Next, a specific structural example of the memory circuit 12 including a cell array 20 will be described.

Figure 10:
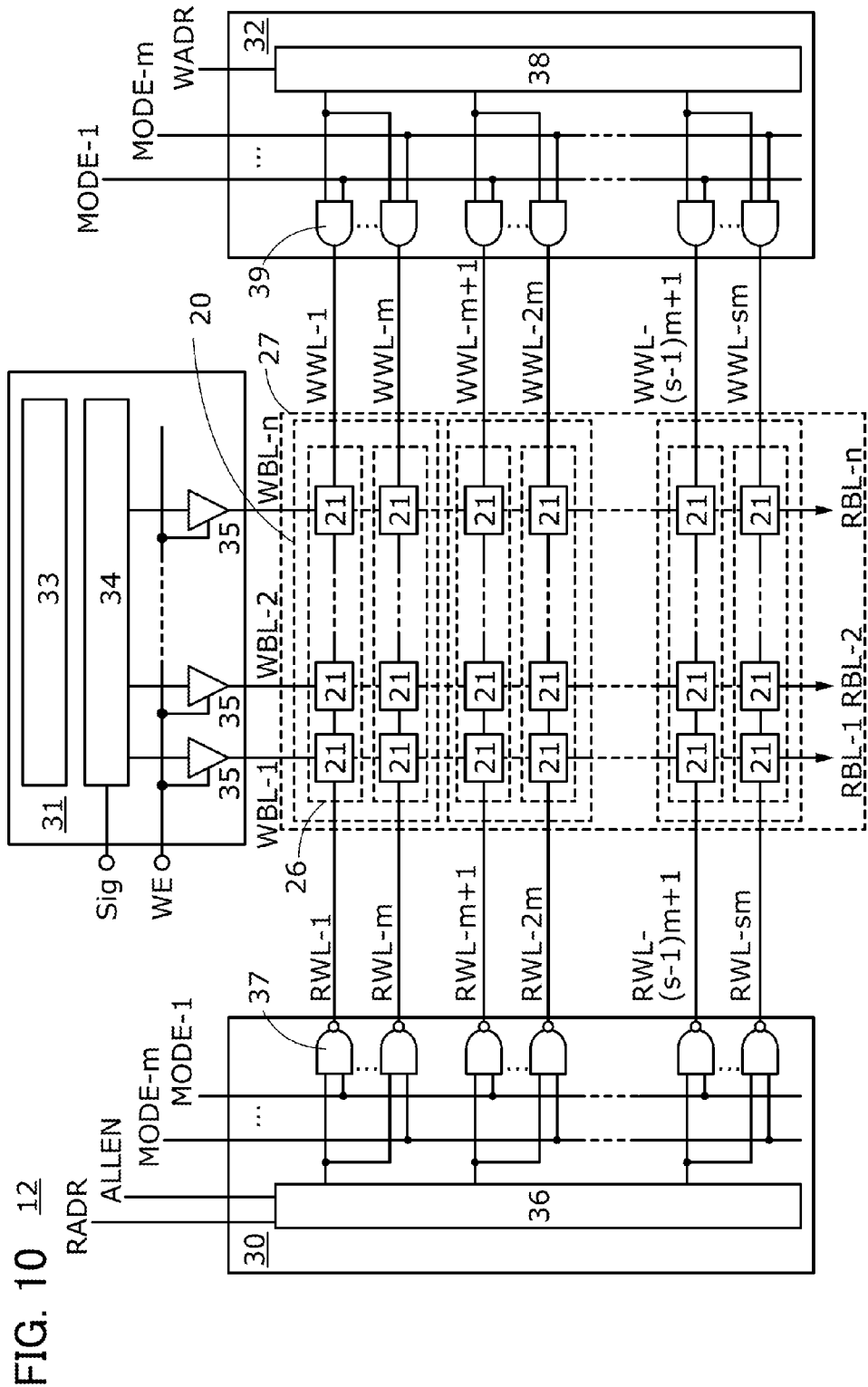
FIG. 10 illustrates a structural example of a memory circuit.

The memory circuit 12 illustrated in FIG. 10 includes a cell array 27 that has the cell arrays 20, a driver circuit 30 that has a function of controlling the supply of potentials to the wirings RWL, a driver circuit 31 that has a function of controlling the supply of signals containing data to the wirings WBL, and a driver circuit 32 that has a function of controlling the supply of potentials to the wirings WWL. Note that s cell arrays 20 (s is a natural number greater than or equal to 2) are provided in the direction that the wirings WBL extend.

Note that the driver circuit 30, the driver circuit 31, or the driver circuit 32 may have another function, or may lack part of the function, for example. Therefore, the driver circuit 30, the driver circuit 31, or the driver circuit 32 may be referred to simply as a circuit, or may be referred to as a first circuit, a second circuit, or the like.

The driver circuit 31 includes a circuit 33 which includes a shift register, a decoder, or the like and which has a function of controlling the timing of sampling a signal Sig containing data; a circuit 34 which has a function of sampling the signal Sig at the timing determined by the circuit 33; and a plurality of switches 35 each of which has a function of controlling the supply of the sampled signal to the wiring WBL. FIG. 10 illustrates the case where a three-state buffer, the impedance of which is set high in accordance with a signal WE, is used as each of the switches 35.

Specifically, in FIG. 10, when the potential of the signal WE is at a high level, the switches 35 supply signals with the same logical values as signals input to input terminals to the wirings WBL. On the other hand, when the potential of the signal WE is at a low level, the switches 35 have high impedance and the signals input to the input terminals are not supplied to the wirings WBL.

In the case where the memory circuit 12 functions as a buffer memory device, or in the case where the memory circuit 12 has a function of storing configuration data, the driver circuit 31 preferably has a structure with which data can be supplied to the cell array 27 in parallel across the data width of the buffer memory device as illustrated in FIG. 10.

The driver circuit 30 controls the potentials of the wirings RWL to select one group 26 that determines the electrical connection between the plurality of wirings RBL and the plurality of wirings SL, from the groups 26 included in each of the cell arrays 20. Furthermore, the driver circuit 30 controls the potentials of the wirings RWL to select one group 26 from which data is read out, from the groups 26 included in each of the cell arrays 20.

The driver circuit 30 illustrated in FIG. 10 includes, specifically, a circuit 36 which has a function of generating signals for selecting one cell array 20 from the plurality of cell arrays 20, and a plurality of circuits 37 which have a function of selecting one group 26 in the selected cell array 20 according to signals input to wirings MODE-1 to MODE-m. As the circuit 36, a decoder can be used, for example. As the circuits 37, NAND circuits can be used, for example.

To select one group 26 from the groups 26, which are included in each of the cell arrays 20 storing data containing the circuit structure, in the driver circuit 30 illustrated in FIG. 10, the potentials of all signals output from the circuit 36 are set to high levels and the potential of only the wiring MODE connected to the group 26 to be selected, among the wirings MODE-1 to MODE-m, is set to a high level. Note that with the structure illustrated in FIG. 10, whether the potentials of all the signals output from the circuit 36 are set to high levels is determined depending on a potential supplied from a wiring ALLEN to the circuit 36.

In the driver circuit 30 illustrated in FIG. 10, when a signal containing data on an address, which is supplied from a wiring RADR, is decoded by the circuit 36, one group 26 from which data is read is selected from the groups 26. When one group 26 is selected, the electrical connection between the plurality of wirings RBL and the plurality of wirings SL can be determined. A predetermined potential such as a ground potential is supplied to the wirings SL while one group 26 is selected by the driver circuit 30, whereby data stored in each of the circuits 21 of the selected group 26 can be output to wirings RBL-1 to RBL-n.

The driver circuit 32 controls the potentials of wirings WWL-1 to WWL-sm to select one group 26 to which data is written, from the groups 26 included in each of the cell arrays 20.

The driver circuit 32 illustrated in FIG. 10 includes, specifically, a circuit 38 which has a function of generating signals for selecting one cell array 20 from the plurality of cell arrays 20, and a plurality of circuits 39 which have a function of selecting one group 26 in the selected cell array 20 according to signals input to the wirings MODE-1 to MODE-m. As the circuit 38, a decoder can be used, for example. As the circuits 39, AND circuits can be used, for example. In addition, to select one cell array 20 to which data is written, in the driver circuit 32 illustrated in FIG. 10, a signal containing data on an address, which is supplied from a wiring WADR, is decoded by the circuit 38.

<Operation Example of Memory Circuit>

Next, an example of the operation of the memory circuit 12 in which the semiconductor device 10 illustrated in FIG. 5 includes the memory circuit 12 illustrated in FIGS. 9 and 10 will be described with reference to a timing chart in FIG. 11.

Figure 11:
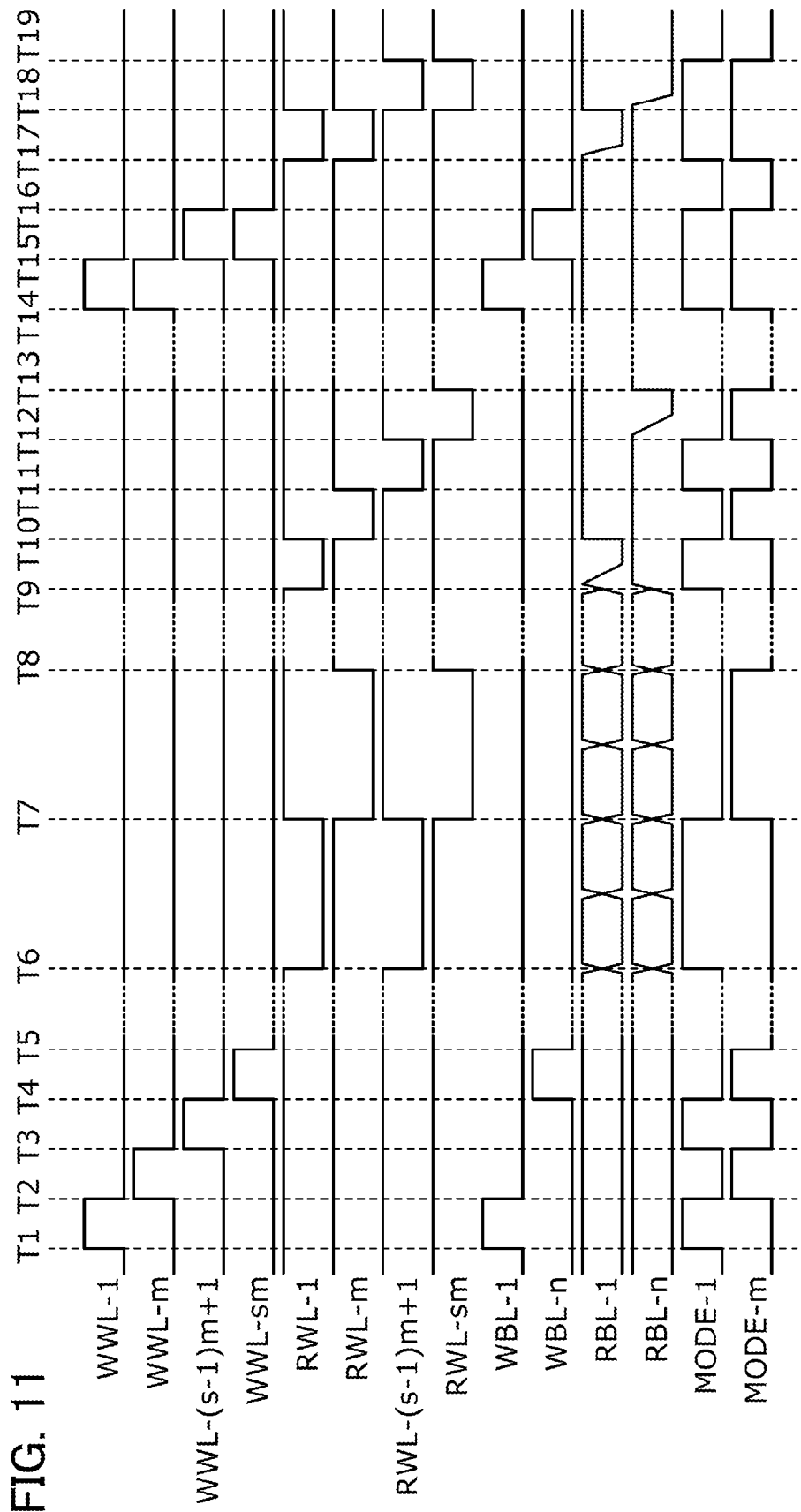
FIG. 11 is a timing chart.

In the timing chart in FIG. 11, a period from time T1 to time T5 corresponds to a period for storing data in the cell array 27. Specifically, in the case where the memory circuit 12 has a function of storing a start-up routine, the above period corresponds to a period for storing data corresponding to the start-up routine in the cell array 27 before stopping the supply of power to the semiconductor device 10. Alternatively, in the case where the memory circuit 12 functions as a buffer memory device, the above period specifically corresponds to a period for storing data in the cell array 27. Alternatively, in the case where the memory circuit 12 has both a function of storing configuration data and a function of a switch for controlling the electrical connection between the plurality of circuits 19 according to the configuration data, the above period specifically corresponds to a period for storing the configuration data.

First, in a period from time T1 to time T2, the signal containing data on an address (hereinafter referred to as an address signal), which is supplied to the wiring WADR, is decoded by the circuit 38. Thus, a high-level potential is supplied from the circuit 38 to the circuits 39 corresponding to the wirings WWL-1 to WWL-m among the plurality of circuits 39. In addition, in the period from time T1 to time T2, a high-level potential is supplied to the wiring MODE-1 among the wirings MODE-1 to MODE-m, and a low-level potential is supplied to all the wirings MODE except the wiring MODE-1. By the above operation, a high-level potential is supplied to the wiring WWL-1, whereby the group 26 corresponding to the wiring WWL-1 is selected. A high-level potential is supplied to the wiring WBL-1, and a low-level potential is supplied to the wiring WBL-n, whereby in the above group 26, data "1" is written to the circuit 21 in the first row and the first column, and data "0" is written to the circuit 21 in the first row and the n-th column.

Next, in a period from time T2 to time T3, the address signal, which is supplied to the wiring WADR, is decoded by the circuit 38. Thus, the high-level potential is supplied from the circuit 38 to the circuits 39 corresponding to the wirings WWL-1 to WWL-m among the plurality of circuits 39. In addition, in the period from time T2 to time T3, the high-level potential is supplied to the wiring MODE-m among the wirings MODE-1 to MODE-m, and the low-level potential is supplied to all the wirings MODE except the wiring MODE-m. By the above operation, the high-level potential is supplied to the wiring WWL-m, whereby the group 26 corresponding to the wiring WWL-m is selected. The low-level potential is supplied to the wiring WBL-1, and the low-level potential is supplied to the wiring WBL-n, whereby in the above group 26, data "0" is written to the circuit 21 in the m-th row and the first column, and data "0" is written to the circuit 21 in the m-th row and the n-th column.

Next, in a period from time T3 to time T4, the address signal, which is supplied to the wiring WADR, is decoded by the circuit 38. Thus, the high-level potential is supplied from the circuit 38 to the circuits 39 corresponding to the wirings WWL-(s−1)m+1 to WWL-sm among the plurality of circuits 39. In addition, in the period from time T3 to time T4, the high-level potential is supplied to the wiring MODE-1 among the wirings MODE-1 to MODE-m, and the low-level potential is supplied to all the wirings MODE except the wiring MODE-1. By the above operation, the high-level potential is supplied to the wiring WWL-(s−1)m+1, whereby the group 26 corresponding to the wiring WWL-(s−1)m+1 is selected. The low-level potential is supplied to the wiring WBL-1, and the low-level potential is supplied to the wiring WBL-n, whereby in the above group 26, data "0" is written to the circuit 21 in the ((s−1)m+1)-th row and the first column, and data "0" is written to the circuit 21 in the ((s−1)m+1)-th row and the n-th column.

Next, in a period from time T4 to time T5, the address signal, which is supplied to the wiring WADR, is decoded by the circuit 38. Thus, the high-level potential is supplied from the circuit 38 to the circuits 39 corresponding to the wirings WWL-(s−1)m+1 to WWL-sm among the plurality of circuits 39. In addition, in the period from time T4 to time T5, the high-level potential is supplied to the wiring MODE-m among the wirings MODE-1 to MODE-m, and the low-level potential is supplied to all the wirings MODE except the wiring MODE-m. By the above operation, the high-level potential is supplied to the wiring WWL-sm, whereby the group 26 corresponding to the wiring WWL-sm is selected. The low-level potential is supplied to the wiring WBL-1, and the high-level potential is supplied to the wiring WBL-n, whereby in the above group 26, data "0" is written to the circuit 21 in the sm-th row and the first column, and data "1" is written to the circuit 21 in the sm-th row and the n-th column.

In the timing chart in FIG. 11, in the case where the memory circuit 12 has a function of a switch for controlling the electrical connection between the plurality of circuits 19, a period from time T6 to time T8 corresponds to a period where the plurality of circuits 19 operate according to configuration data. Note that the case where output signals from the circuits 19 are supplied to the wirings RBL-1 to RBL-n and the potentials of the wirings SL-1 to SL-n are supplied as input signals to the circuits 19 is described below as one example.

First, in a period from time T6 to time T7, a high-level potential is supplied from the circuit 36 to all the circuits 37. The high-level potential is supplied to the wiring MODE-1 among the wirings MODE-1 to MODE-m, and the low-level potential is supplied to all the wirings MODE except the wiring MODE-1. By the above operation, a low-level potential is supplied to the wirings RWL whose potentials are controlled by the circuits 37 corresponding to the wiring MODE-1. Thus, the groups 26 corresponding to the wirings RWL-1, RWL-(m+1), RWL-(s−1)m+1, and the like are selected, and the plurality of circuits 19 operate according to the configuration data stored in the circuits 21 in these groups 26.

Next, in a period from time T7 to time T8, the high-level potential is supplied from the circuit 36 to all the circuits 37. The high-level potential is supplied to the wiring MODE-m among the wirings MODE-1 to MODE-m, and the low-level potential is supplied to all the wirings MODE except the wiring MODE-m. By the above operation, the low-level potential is supplied to the wirings RWL whose potentials are controlled by the circuits 37 corresponding to the wiring MODE-m. Thus, the groups 26 corresponding to the wirings RWL-m, RWL-2m, RWL-sm, and the like are selected, and the plurality of circuits 19 operate according to the configuration data stored in the circuits 21 in these groups 26.

Next, in the case where the memory circuit 12 has a function of storing a start-up routine, a period from time T9 to time T13 corresponds to a period for reading data stored in the cell array 27. In the case where the memory circuit 12 functions as a buffer memory device, the period from time T9 to time T13 corresponds to a period for reading data stored in the cell array 27. Note that in either case, after time T5, the above-described operation in the period from time T6 to time T8 is not performed and the operation in the period from time T9 to time T13 is performed. In addition, in either case, in the period from time T9 to time T13, the low-level potential is supplied to the wirings SL-1 to SL-n.

First, in a period from time T9 to time T10, the potentials of the wirings RBL-1 to RBL-n are initialized by supplying a potential different from the potential supplied to the wirings SL-1 to SL-n, such as a high-level potential, to the wirings RBL-1 to RBL-n. Then, the address signal supplied to the wiring RADR is decoded by the circuit 36. Thus, the low-level potential is supplied from the circuit 36 to the circuits 37 corresponding to the wirings RWL-1 to RWL-m among the plurality of circuits 37. In addition, in the period from time T9 to time T10, the high-level potential is supplied to the wiring MODE-1 among the wirings MODE-1 to MODE-m, and the low-level potential is supplied to all the wirings MODE except the wiring MODE-1. By the above operation, the low-level potential is supplied to the wiring RWL-1, whereby the group 26 corresponding to the wiring RWL-1 is selected. Since the data "1" and the data "0" are written respectively to the circuit 21 in the first row and the first column and the circuit 21 in the first row and the n-th column in the period from time Ti to time T2, when the group 26 corresponding to the wiring RWL-1 is selected, the low-level potential is supplied to the wiring RBL-1 from the wiring SL-1, and the high-level potential is maintained at the wiring RBL-n. That is, the potentials of the wirings RBL-1 and RBL-n depend on the data stored in the circuits 21; thus, data stored in the circuits 21 in the group 26 corresponding to the wiring RWL-1 can be determined from the potentials of the wirings RBL-1 and RBL-n.

Next, in a period from time T10 to time T11, the potentials of the wirings RBL-1 to RBL-n are initialized by supplying a potential different from the potential supplied to the wirings SL-1 to SL-n, such as a high-level potential, to the wirings RBL-1 to RBL-n. Then, the address signal supplied to the wiring RADR is decoded by the circuit 36. Thus, the low-level potential is supplied from the circuit 36 to the circuits 37 corresponding to the wirings RWL-1 to RWL-m among the plurality of circuits 37. In addition, in the period from time T10 to time T11, the high-level potential is supplied to the wiring MODE-m among the wirings MODE-1 to MODE-m, and the low-level potential is supplied to all the wirings MODE except the wiring MODE-m. By the above operation, the low-level potential is supplied to the wiring RWL-m, whereby the group 26 corresponding to the wiring RWL-m is selected. Since the data "0" and the data "0" are written respectively to the circuit 21 in the m-th row and the first column and the circuit 21 in the m-th row and the n-th column in the period from time T2 to time T3, when the group 26 corresponding to the wiring RWL-m is selected, the high-level potential is maintained at the wirings RBL-1 and RBL-n. That is, the potentials of the wirings RBL-1 and RBL-n depend on the data stored in the circuits 21; thus, data stored in the circuits 21 in the group 26 corresponding to the wiring RWL-m can be determined from the potentials of the wirings RBL-1 and RBL-n.

Next, in a period from time T11 to time T12, the potentials of the wirings RBL-1 to RBL-n are initialized by supplying a potential different from the potential supplied to the wirings SL-1 to SL-n, such as a high-level potential, to the wirings RBL-1 to RBL-n. Then, the address signal supplied to the wiring RADR is decoded by the circuit 36. Thus, the high-level potential is supplied from the circuit 36 to the circuits 37 corresponding to the wirings RWL-(s−1)m+1 to RWL-sm among the plurality of circuits 37. In addition, in the period from time T11 to time T12, the high-level potential is supplied to the wiring MODE-1 among the wirings MODE-1 to MODE-m, and the low-level potential is supplied to all the wirings MODE except the wiring MODE-1. By the above operation, the low-level potential is supplied to the wiring RWL-(s−1)m+1, whereby the group 26 corresponding to the wiring RWL-(s−1)m+1 is selected. Since the data "0" and the data "0" are written respectively to the circuit 21 in the ((s−1)m+1)-th row and the first column and the circuit 21 in the ((s−1)m+1)-th row and the n-th column in the period from time T3 to time T4, when the group 26 corresponding to the wiring RWL-(s−1)m+1 is selected, the high-level potential is maintained at the wirings RBL-1 and RBL-n. That is, the potentials of the wirings RBL-1 and RBL-n depend on the data stored in the circuits 21; thus, data stored in the circuits 21 in the group 26 corresponding to the wiring RWL-(s−1)m+1 can be determined from the potentials of the wirings RBL-1 and RBL-n.

Next, in a period from time T12 to time T13, the potentials of the wirings RBL-1 to RBL-n are initialized by supplying a potential different from the potential supplied to the wirings SL-1 to SL-n, such as a high-level potential, to the wirings RBL-1 to RBL-n. Then, the address signal supplied to the wiring RADR is decoded by the circuit 36. Thus, the high-level potential is supplied from the circuit 36 to the circuits 37 corresponding to the wirings RWL-(s−1)m+1 to RWL-sm among the plurality of circuits 37. In addition, in the period from time T12 to time T13, the high-level potential is supplied to the wiring MODE-m among the wirings MODE-1 to MODE-m, and the low-level potential is supplied to all the wirings MODE except the wiring MODE-m. By the above operation, the low-level potential is supplied to the wiring RWL-sm, whereby the group 26 corresponding to the wiring RWL-sm is selected. Since the data "0" and the data "1" are written respectively to the circuit 21 in the sm-th row and the first column and the circuit 21 in the sm-th row and the n-th column in the period from time T4 to time T5, when the group 26 corresponding to the wiring RWL-sm is selected, the high-level potential is maintained at the wiring RBL-1, and the low-level potential is supplied to the wiring RBL-n from the wiring SL-n. That is, the potentials of the wirings RBL-1 and RBL-n depend on the data stored in the circuits 21; thus, data stored in the circuits 21 in the group 26 corresponding to the wiring RWL-sm can be determined from the potentials of the wirings RBL-1 and RBL-n.

In the timing chart illustrated in FIG. 11, in the case where the memory circuit 12 functions as a buffer memory device, a period from time T14 to time T19 corresponds to a period for writing data to the memory circuit 12 and a period for reading data from the memory circuit 12. Note that the timing chart in FIG. 11 shows an example where a method for writing data to the memory circuit 12 in the period from time T1 to time T5 differs from a method for writing data to the memory circuit 12 in a period from time T14 to time T16. In addition, the timing chart in FIG. 11 shows an example where a method for reading data from the memory circuit 12 in the period from time T9 to time T13 differs from a method for reading data from the memory circuit 12 in a period from time T17 to time T19.

First, in a period from time T14 to time T15, the address signal supplied to the wiring WADR is decoded by the circuit 38. Thus, the high-level potential is supplied from the circuit 38 to the circuits 39 corresponding to the wirings WWL-1 to WWL-m among the plurality of circuits 39. In addition, in the period from time T14 to time T15, the high-level potential is supplied to the wirings MODE-1 and MODE-m among the wirings MODE-1 to MODE-m, and the low-level potential is supplied to all the wirings MODE except the wirings MODE-1 and MODE-m. By the above operation, the high-level potential is supplied to the wirings WWL-1 and WWL-m, whereby the groups 26 corresponding to the wirings WWL-1 and WWL-m are selected. The high-level potential and the low-level potential are supplied to the wiring WBL-1 and the wiring WBL-n respectively, whereby in the above groups 26, data "1" is written to the circuits 21 in the first and m-th rows and the first column, and data "0" is written to the circuits 21 in the first and m-th rows and the n-th column.

Next, in a period from time T15 to time T16, the address signal supplied to the wiring WADR is decoded by the circuit 38. Thus, the high-level potential is supplied from the circuit 38 to the circuits 39 corresponding to the wirings WWL-(s−1)m+1 to WWL-sm among the plurality of circuits 39. In addition, in the period from time T15 to time T16, the high-level potential is supplied to the wirings MODE-1 and MODE-m among the wirings MODE-1 to MODE-m, and the low-level potential is supplied to all the wirings MODE except the wirings MODE-1 and MODE-m. By the above operation, the high-level potential is supplied to the wirings WWL-(s−1)m+1 and WWL-sm, whereby the groups 26 corresponding to the wirings WWL-(s−1)m+1 and WWL-sm are selected. The low-level potential and the high-level potential are supplied to the wiring WBL-1 and the wiring WBL-n respectively, whereby in the above groups 26, data "0" is written to the circuits 21 in the ((s−1)m+1)-th and sm-th rows and the first column, and data "1" is written to the circuits 21 in the ((s−1)m+1)-th and sm-th rows and the n-th column.

Next, in a period from time T17 to time T18, the low-level potential is supplied to the wirings SL-1 to SL-n. In addition, the potentials of the wirings RBL-1 to RBL-n are initialized by supplying a potential different from the potential supplied to the wirings SL-1 to SL-n, such as a high-level potential, to the wirings RBL-1 to RBL-n. Furthermore, the address signal supplied to the wiring RADR is decoded by the circuit 36. Thus, the high-level potential is supplied from the circuit 36 to the circuits 37 corresponding to the wirings RWL-1 to RWL-m among the plurality of circuits 37. In addition, in the period from time T17 to time T18, the high-level potential is supplied to the wirings MODE-1 and MODE-m, and the low-level potential is supplied to all the wirings MODE except the wirings MODE-1 and MODE-m. By the above operation, the low-level potential is supplied to the wirings RWL-1 and RWL-m, whereby the groups 26 corresponding to the wirings RWL-1 and RWL-m are selected. Since the data "1" and the data "0" are written respectively to the circuits 21 in the first and m-th rows and the first column and the circuits 21 in the first and m-th rows and the n-th column in the period from time T14 to time T15, when the groups 26 corresponding to the wirings RWL-1 and RWL-m are selected, the low-level potential is supplied to the wiring RBL-1 from the wiring SL-1, and the high-level potential is maintained at the wiring RBL-n. That is, the potentials of the wirings RBL-1 and RBL-n depend on the data stored in the circuits 21; thus, data stored in the circuits 21 in the groups 26 corresponding to the wirings RWL-1 and RWL-m can be determined from the potentials of the wirings RBL-1 and RBL-n.

In the period from time T17 to time T18, unlike in the case where data is read from the memory circuit 12 in the period from time T9 to time T13, the low-level potential is supplied to the wiring RBL-1 from the wiring SL-1 through the plurality of circuits 21, specifically, the circuit 21 in the first row and the first column and the circuit 21 in the m-th row and the first column. Thus, the potential of the wiring RBL-1 can be changed from the high level to the low level more rapidly than in data reading in the period from time T9 to time T13; thus, data "1" can be read rapidly.

Next, in a period from time T18 to time T19, the low-level potential is supplied to the wirings SL-1 to SL-n. In addition, the potentials of the wirings RBL-1 to RBL-n are initialized by supplying a potential different from the potential supplied to the wirings SL-1 to SL-n, such as a high-level potential, to the wirings RBL-1 to RBL-n. Furthermore, the address signal supplied to the wiring RADR is decoded by the circuit 36. Thus, the high-level potential is supplied from the circuit 36 to the circuits 37 corresponding to the wirings RWL-(s−1)m+1 to RWL-sm among the plurality of circuits 37. In addition, in the period from time T18 to time T19, the high-level potential is supplied to the wirings MODE-1 and MODE-m, and the low-level potential is supplied to all the wirings MODE except the wirings MODE-1 and MODE-m. By the above operation, the low-level potential is supplied to the wirings RWL-(s−1)m+1 and RWL-sm, whereby the groups 26 corresponding to the wirings RWL-(s−1)m+1 and RWL-sm are selected. Since the data "0" and the data "1" are written respectively to the circuits 21 in the ((s−1)m+1)-th and sm-th rows and the first column and the circuits 21 in the ((s−1)m+1)-th and sm-th rows and the n-th column in the period from time T15 to time T16, when the groups 26 corresponding to the wirings RWL-(s−1)m+1 and RWL-sm are selected, the high-level potential is maintained at the wiring RBL-1, and the low-level potential is supplied to the wiring RBL-n from the wiring SL-n. That is, the potentials of the wirings RBL-1 and RBL-n depend on the data stored in the circuits 21; thus, data stored in the circuits 21 in the groups 26 corresponding to the wirings RWL-(s−1)m+1 and RWL-sm can be determined from the potentials of the wirings RBL-1 and RBL-n.

In the period from time T18 to time T19, unlike in the case where data is read from the memory circuit 12 in the period from time T9 to time T13, the low-level potential is supplied to the wiring RBL-n from the wiring SL-n through the plurality of circuits 21, specifically, the circuit 21 in the ((s−1)m+1)-th row and the n-th column and the circuit 21 in the sm-th row and the n-th column. Thus, the potential of the wiring RBL-n can be changed from the high level to the low level more rapidly than in data reading in the period from time T9 to time T13; thus, data "1" can be read rapidly.

Note that the timing chart in FIG. 11 shows an example where in the period from time T14 to time T16 or in the period from time T17 to time T19, in order to select the groups 26, the high-level potential is supplied to the wirings MODE-1 and MODE-m and the low-level potential is supplied to all the wirings MODE except the wirings MODE-1 and MODE-m. Note that in one embodiment of the present invention, in order to select a plurality of groups 26 in the period for writing data or in the period for reading data, the high-level potential is supplied to some of all the wirings MODE. The number and type of the wirings MODE to which the high-level potential is supplied can be set by a designer as appropriate.

<Structural Example of Circuit 19>

Figure 14:
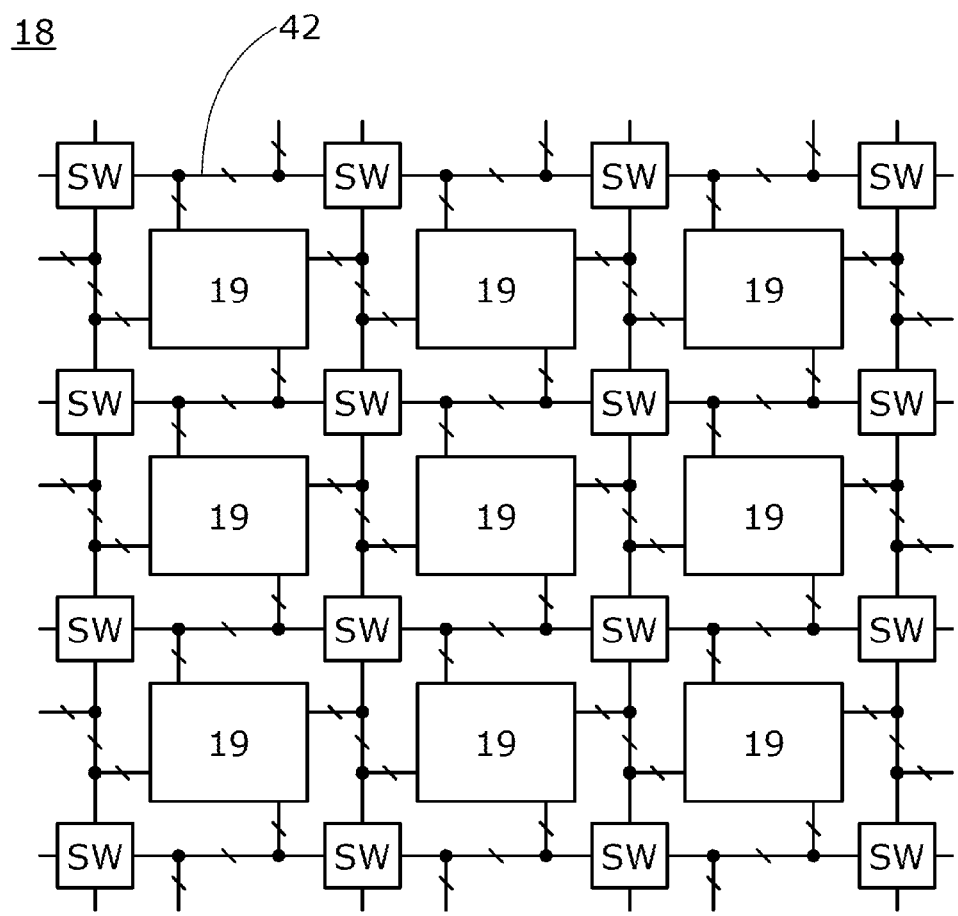
FIG. 14 illustrates a partial structure of a logic circuit.

Next, an example of a structure of the logic circuit 18 in FIG. 5 is illustrated in FIG. 14. Input or output terminals of the plurality of circuits 19 in the logic circuit 18 are electrically connected to a plurality of wirings 42. The plurality of wirings 42 in the logic circuit 18 are electrically connected to switches SW having a function of controlling electrical connection between the wirings 42. The electrical connection between the circuits 19 is controlled with the plurality of wirings 42 and the switches SW.

Note that the plurality of circuits 19 may be electrically connected to wirings having a function of supplying a signal CLK or a signal RES to the circuits 19, in addition to the plurality of wirings 42. The signal CLK can be used to control the timing of signal output from a flip-flop of the circuit 19, for example. The signal RES can be used to control the timing of initialization of data stored in the flip-flop of the circuit 19, for example.

Figure 15A:
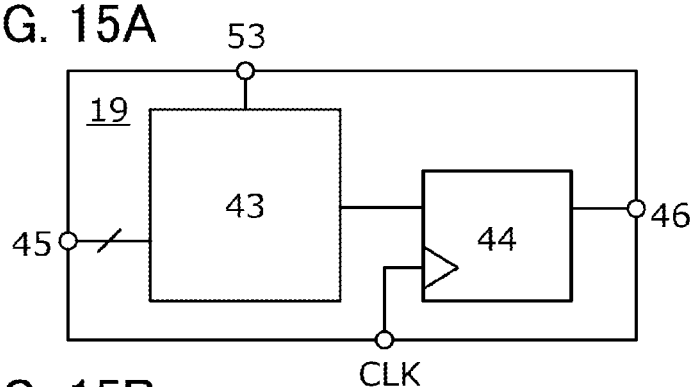
FIGS. 15A to 15D each illustrate a specific circuit structure.

FIG. 15A illustrates one embodiment of the circuit 19. The circuit 19 in FIG. 15A includes a look-up table (LUT) 43 and a flip-flop 44. In the circuit 19 in FIG. 15A, configuration data stored in the memory circuit 12 is supplied to the LUT 43 through a terminal 53. In the LUT 43, the logical value of an output signal with respect to the logical value of an input signal that is input to an input terminal 45 is determined according to configuration data. The flip-flop 44 retains data contained in the output signal of the LUT 43 and outputs an output signal corresponding to the data in synchronization with a signal CLK from an output terminal 46.

The type of the flip-flop 44 may be determined by the configuration data. Specifically, the flip-flop 44 may have a function of any of a D flip-flop, a T flip-flop, a JK flip-flop, and an RS flip-flop according to the configuration data.

Figure 15B:
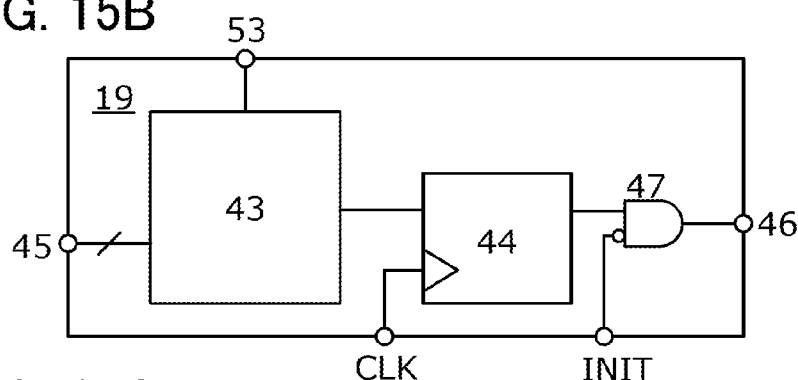

FIG. 15B illustrates another embodiment of the circuit 19. The circuit 19 illustrated in FIG. 15B includes an AND circuit 47 in addition to the components of the circuit 19 in FIG. 15A. To the AND circuit 47, a signal from the flip-flop 44 is supplied as an active high input, and the potential of a signal NIT is supplied as an active low input. With the above structure, the potential of the output terminal 46 can be initialized depending on the potential of the signal NIT.

Figure 15C:
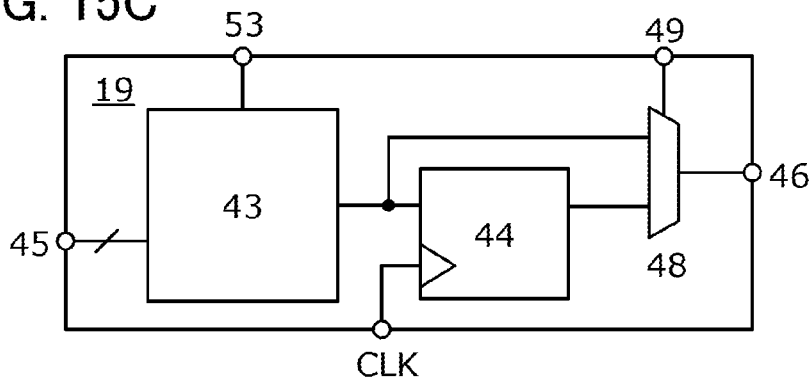

FIG. 15C illustrates another embodiment of the circuit 19. The circuit 19 in FIG. 15C includes a multiplexer 48 in addition to the components of the circuit 19 in FIG. 15A. In the circuit 19 in FIG. 15C, configuration data stored in the memory circuit 12 is supplied to the multiplexer 48 through a terminal 49.

In the LUT 43, the logical value of an output signal with respect to the logical value of an input signal is determined according to configuration data. A signal output from the LUT 43 and a signal output from the flip-flop 44 are input to the multiplexer 48. The multiplexer 48 has functions of selecting and outputting one of the two output signals in accordance with configuration data. The signal output from the multiplexer 48 is output from the output terminal 46.

Figure 15D:
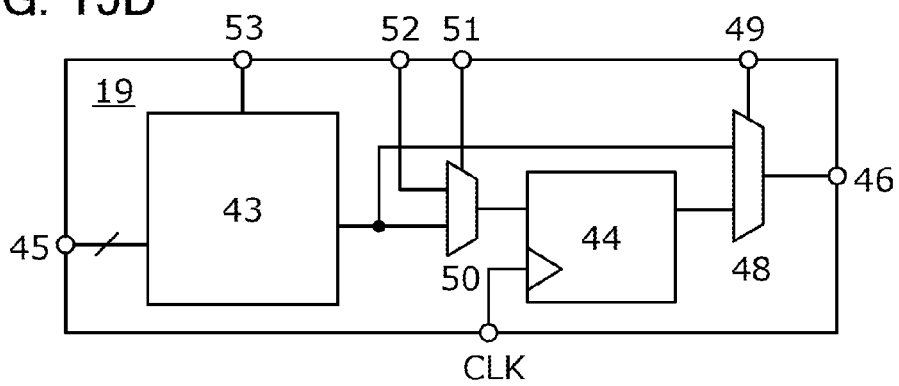

FIG. 15D illustrates another embodiment of the circuit 19. The circuit 19 in FIG. 15D includes a multiplexer 50 in addition to the components of the circuit 19 in FIG. 15C. In the circuit 19 in FIG. 15D, configuration data stored in the memory circuit 12 is supplied to the multiplexer 50 through a terminal 51.

A signal output from the LUT 43 and a signal output from the flip-flop 44 of another circuit 19 and input through a terminal 52 are input to the multiplexer 50. The multiplexer 50 has functions of selecting and outputting one of the two output signals in accordance with configuration data.

<Example of Cross-Sectional Structure of Semiconductor Device>

Figure 16:
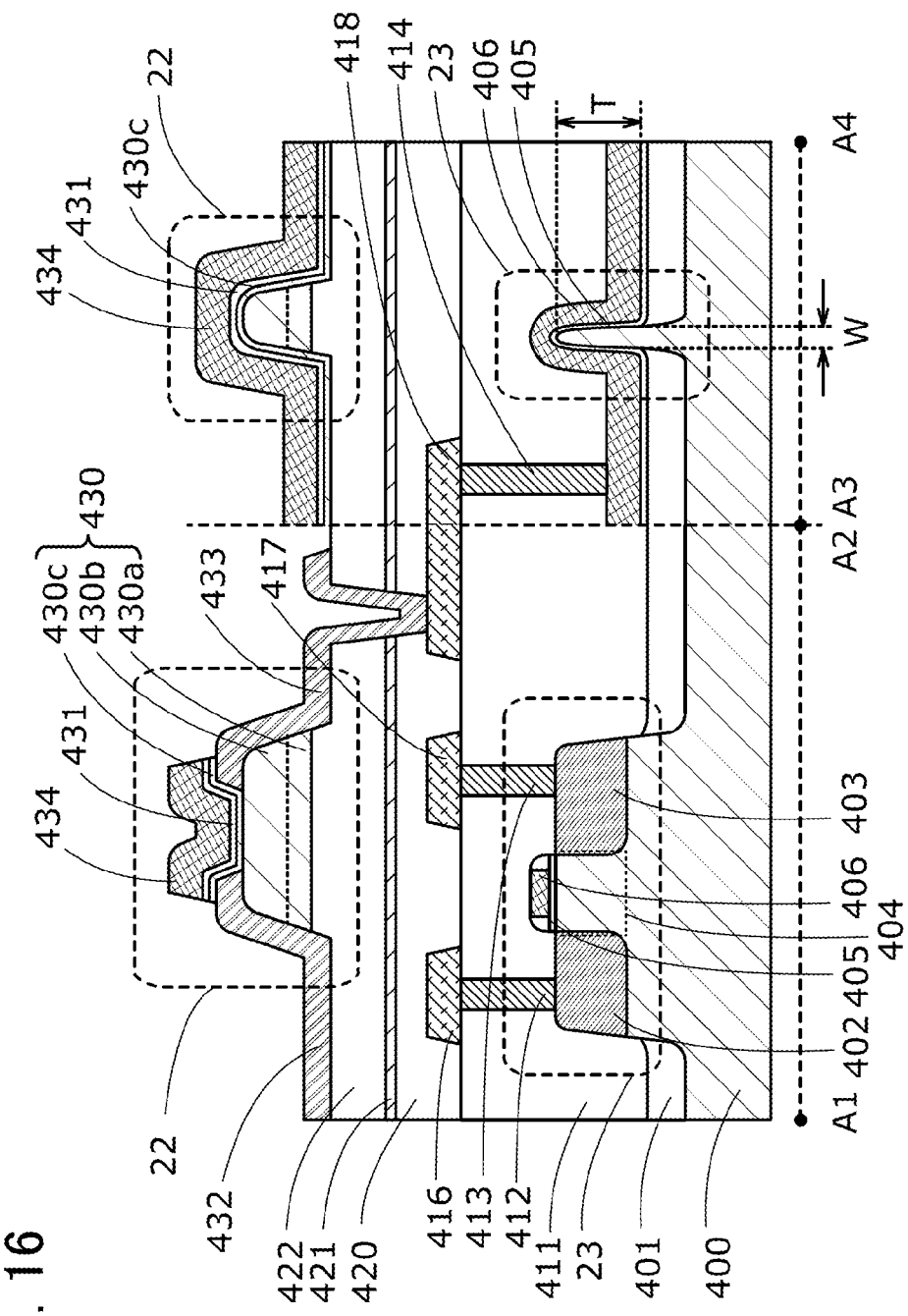
FIG. 16 illustrates a cross-sectional structure of a semiconductor device.

FIG. 16 illustrates an example of a cross-sectional structure of a semiconductor device including the circuit 21 in FIG. 9. A region along dashed line A1-A2 shows a structure of any of the transistors 100, 102, 108, 110, 22, 23, and 24 in the channel length direction, and a region along dashed line A3-A4 shows a structure of any of the transistors 100, 102, 108, 110, 22, 23, and 24 in the channel width direction. Note that in one embodiment of the present invention, the channel length direction of one transistor is not necessarily aligned with the channel length direction of another transistor.

The channel length direction refers to a direction in which a carrier moves between a pair of impurity regions functioning as a source region and a drain region by the most direct way, and the channel width direction refers to a direction perpendicular to the channel length direction in a plane parallel to a substrate.

In FIG. 16, one of the transistors 22, 102, 110, and the like as a transistor including a channel formation region in an oxide semiconductor film is formed over one of the transistors 23, 24, 100, 108, and the like as a transistor including a channel formation region in a single crystal silicon substrate. That is, the transistor 23, 24, 100, 108, or the like may be formed on a single crystal silicon substrate, and the transistor 22, 102, 110, or the like may be formed thereover as the transistor including a channel formation region in an oxide semiconductor film. FIG. 16 illustrates an example in which the transistor 22 and the transistor 23 are provided.

The transistor 23, 24, 100, 108, or the like may include the channel formation region in a semiconductor film or a semiconductor substrate of silicon, germanium, or the like in an amorphous, microcrystalline, polycrystalline, or single crystal state.

In the case where the transistor 23, 24, 100, 108, or the like is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 23, 24, 100, 108, or the like is formed can be, for example, a silicon substrate, a germanium substrate, or a silicon germanium substrate. In FIG. 16, a single crystal silicon substrate is used as the substrate 400.

The transistor 23, 24, 100, 108, or the like is electrically isolated by an element isolation method. As the element isolation method, a trench isolation method (a shallow trench isolation (STI) method) or the like can be used. FIG. 16 illustrates an example where the trench isolation method is used to electrically isolate the transistor 23, 24, 100, 108, or the like. Specifically, in FIG. 16, the transistor 23, 24, 100, 108, or the like is electrically isolated by element isolation using an element isolation region 401 formed in such a manner that an insulator including silicon oxide or the like is buried in a trench formed in the substrate 400 by etching or the like and then the insulator is removed partly by etching or the like.

Note that the transistors 23, 24, 100, 108, and the like have the same polarity and therefore do not necessarily require element isolation depending on circuit structure. Thus, the layout area can be reduced.

In a projection of the substrate 400 that exists in a region other than the trench, an impurity region 402 and an impurity region 403 of the transistor 23, 24, 100, 108, or the like and a channel formation region 404 placed between the impurity regions 402 and 403 are provided. Further, the transistor 23, 24, 100, 108, or the like includes an insulating film 405 covering the channel formation region 404 and a gate electrode 406 that overlaps with the channel formation region 404 with the insulating film 405 provided therebetween.

In the transistor 23, 24, 100, 108, or the like, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 23, 24, 100, 108, or the like can be reduced, and the number of transferred carriers in the transistor 23, 24, 100, 108, or the like can be increased. As a result, the on-state current and field-effect mobility of the transistor 23, 24, 100, 108, or the like are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 23, 24, 100, 108, or the like can be further increased and the field-effect mobility of the transistor 23, 24, 100, 108, or the like can be further increased.

Note that when the transistor 23, 24, 100, 108, or the like is formed using a bulk semiconductor substrate, the aspect ratio is preferably 0.5 or more, further preferably 1 or more.

An insulating film 411 is provided over the transistor 23, 24, 100, 108, or the like. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 22 is provided over the insulating film 422.

The transistor 22, 102, 110, or the like includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 16, the transistor 22, 102, 110, or the like includes at least the gate electrode 434 on one side of the semiconductor film 430, and may further include a gate electrode overlapping with the semiconductor film 430 with the insulating film 422 positioned therebetween.

In the case where the transistor 22, 102, 110, or the like has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 16, the transistor 22, 102, 110, or the like has a single-gate structure where one channel formation region corresponding to one gate electrode 434 is provided. However, the transistor 22, 102, 110, or the like may have a multi-gate structure where a plurality of electrically connected gate electrodes are provided so that a plurality of channel formation regions are included in one active layer.

FIG. 16 illustrates an example in which the semiconductor film 430 included in the transistor 22, 102, 110, or the like includes oxide semiconductor films 430a to 430c that are stacked in this order over the insulating film 422. Note that in one embodiment of the present invention, the semiconductor film 430 of the transistor 22, 102, 110, or the like may be formed using a single-layer oxide semiconductor film.

Note that the transistor 22 is a p-channel transistor in the circuit structure illustrated in FIG. 25 or FIG. 26. In that case, the transistor 22 has a structure similar to that of the transistor 23, 24, 100, 108, or the like.

<Transistor>

Next, an example of a structure of a transistor 90 that includes a channel formation region in an oxide semiconductor film is described.

Figure 17A:
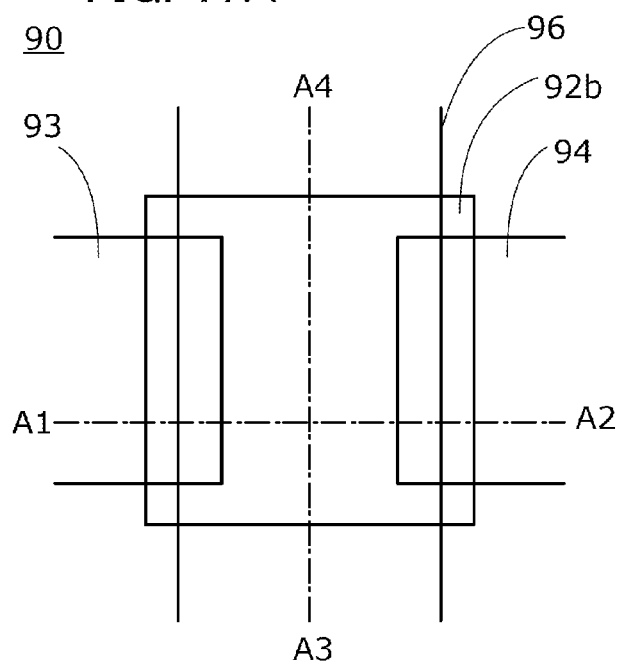
FIGS. 17A to 17C illustrate a structure of a transistor.
Figure 17C:
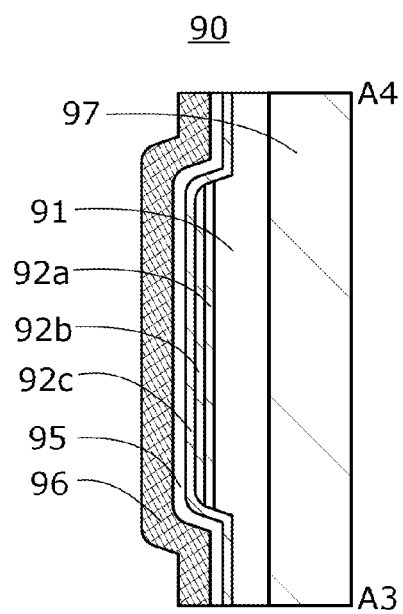
Figure 17B:
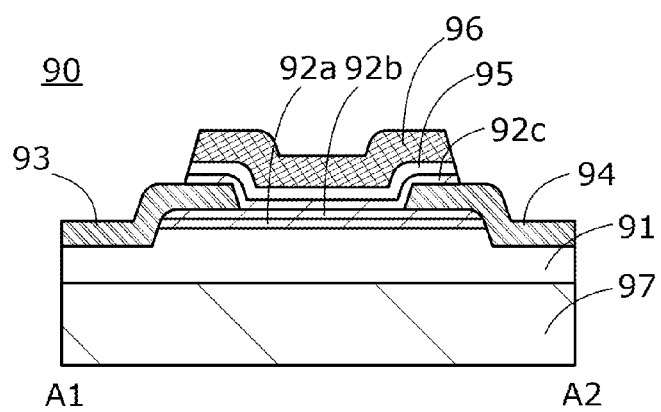

FIGS. 17A to 17C illustrate a structure of the transistor 90 that includes a channel formation region in an oxide semiconductor film as an example. FIG. 17A is a top view of the transistor 90. Note that insulating films are not illustrated in FIG. 17A in order to clarify the layout of the transistor 90. FIG. 17B is a cross-sectional view along the dashed line A1-A2 in the top view in FIG. 17A. FIG. 17C is a cross-sectional view along the dashed line A3-A4 in the top view in FIG. 17A.

As illustrated in FIGS. 17A to 17C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 18A:
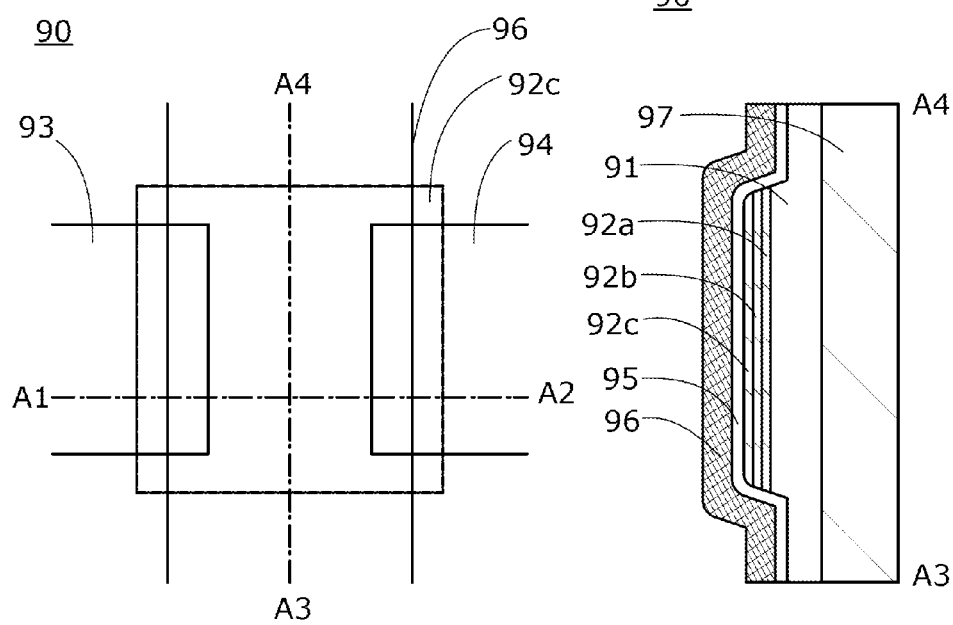
FIGS. 18A to 18C illustrate a structure of a transistor.
Figure 18C:
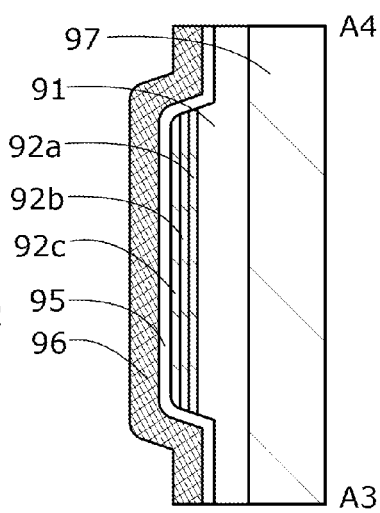
Figure 18B:
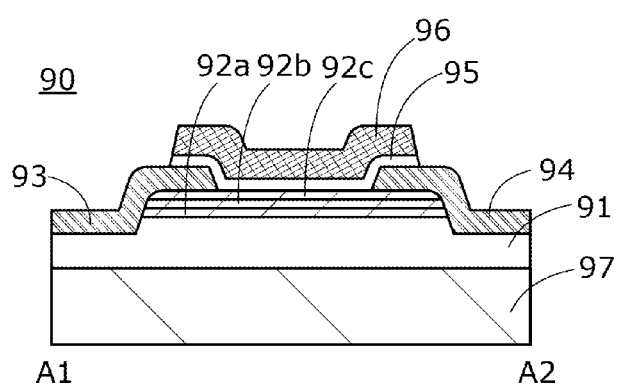

FIGS. 18A to 18C illustrate another specific example of the structure of the transistor 90. FIG. 18A is a top view of the transistor 90. Note that insulating films are not illustrated in FIG. 18A in order to clarify the layout of the transistor 90. FIG. 18B is a cross-sectional view along the dashed line A2-A2 in the top view in FIG. 18A. FIG. 18C is a cross-sectional view along the dashed line A3-A4 in the top view in FIG. 18A.

As illustrated in FIGS. 18A to 18C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 17A to 17C and FIGS. 18A to 18C each illustrate the structural example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5\times10^{-7}$ Pa to $1\times10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible. Specifically, in the case where the oxide semiconductor film 92b is an In—M—Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In—M—Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film (also referred to as IGZO) formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 92b is a CAAC-OS film, the oxide semiconductor film 92b is preferably deposited with the use of a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

The carrier density in a highly purified oxide semiconductor film is decreased by reducing an impurity element. The carrier density can be, for example, $1\times10^{17}$/cm$^3$ or less, $1\times10^{15}$/cm$^3$ or less, $1\times10^{13}$/cm$^3$ or less, or $8\times10^{11}$/cm$^3$ or less. More preferably, the carrier density can be, for example, less than $8\times10^{11}$/cm$^3$, further preferably less than $1\times10^{11}$/cm$^3$, or still further preferably less than $1\times10^{10}$/cm$^3$ and be $1\times10^{-9}$/cm$^3$ or more.

Specifically, various experiments can prove a small off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit time. As a result, it can be seen that, in the case where the voltage between the source electrode and the drain electrode of the transistor is 3 V, a lower off-state current of several tens of yoctoamperes per micrometer (yA/µm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In-Sn-Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide, an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density at g=2.001 due to a dangling bond of silicon be lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 90 illustrated in FIGS. 17A to 17C or FIGS. 18A to 18C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92*b* that do not overlap with the conductive films 93 and 94 overlap with the conductive film 96 in the transistor 90 illustrated in FIGS. 17A to 17C or FIGS. 18A to 18C. Consequently, current that flows between the conductive films 93 and 94 through the end portions of the oxide semiconductor film 92*b* can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92*b* is reduced as a result of reducing the channel length to obtain high on-state current, the transistor 90 can have low off-state current. Consequently, with the short channel length, the transistor 90 can have high on-state current when in an on state and low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92*b* can be increased. The current contributes to an increase in the field-effect mobility and an increase in the on-state current of the transistor 90. When the end portions of the oxide semiconductor film 92*b* overlap with the conductive film 96, carriers flow in a wide region of the oxide semiconductor film 92*b* without being limited to a region in the vicinity of the interface between the oxide semiconductor film 92*b* and the insulating film 95, which results in an increase in the amount of carrier movement in the transistor 90. As a result, the on-state current of the transistor 90 is increased, and the field-effect mobility is increased to greater than or equal to 10 $cm^2V \cdot s$ or to greater than or equal to 20 $cm^2N \cdot s$, for example. Note that here, the field-effect mobility is not an approximate value of the mobility as the physical property of the oxide semiconductor film but is the apparent field-effect mobility in a saturation region of the transistor, which is an index of current drive capability.

A structure of an oxide semiconductor film is described below.

An oxide semiconductor film is classified roughly into a single crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to a TEM image of the CAAC-OS film observed in a direction substantially parallel to a sample surface (cross-sectional TEM image), metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to a TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray beam is incident on a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added may be changed, and the degree of crystallinity in the CAAC-OS film might vary depending on regions.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

With the use of the CAAC-OS film in a transistor, variation in the electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 2:1:3, or 3:1:2. The kinds of powders and the molar ratio for mixing powders may be determined as appropriate depending on the desired target. A CAAC-OS film formed using a target with a molar ratio of In:Ga:Zn=2:1:3 can have a particularly high proportion of regions where a diffraction pattern of CAAC-OS is observed in a predetermined area (also referred to as proportion of CAAC); thus, a transistor having a channel formation region in this CAAC-OS film can have excellent frequency characteristics.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes Na+. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measurement value of a Li concentration is preferably $5 \times 10^{15}/cm^3$ or lower, further preferably $1 \times 10^{15}/cm^3$ or lower. Similarly, the measurement value of a K concentration is preferably $5 \times 10^{15}/cm^3$ or lower, further preferably $1 \times 10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the carbon concentration or the silicon concentration measured by secondary ion mass spectrometry is $1 \times 10^{18}/cm^3$ or lower. In this case, the deterioration of the electrical characteristics of the transistor can be prevented, so that the reliability of a semiconductor device can be improved.

Heat treatment may be performed to further reduce impurities such as moisture and hydrogen contained in the oxide semiconductor film, thereby increasing the purity of the oxide semiconductor film.

For example, the oxide semiconductor film is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere containing an oxidation gas such as oxygen, ozone, or nitrogen oxide at 10 ppm or higher. The inert gas atmosphere refers to an atmosphere which contains the oxidation gas at lower than 10 ppm and is filled with nitrogen or a rare gas.

Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the oxide semiconductor film is formed. For example, the heat treatment may be performed after the oxide semiconductor film is selectively etched.

The heat treatment may be performed at a temperature higher than or equal to 250° C. and lower than or equal to 650° C., preferably higher than or equal to 300° C. and lower than or equal to 500° C. The treatment time is shorter than or equal to 24 hours.

An electric furnace, a rapid thermal annealing (RTA) apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

<Example of Cross-Sectional Structure of Semiconductor Device>

Figure 19:
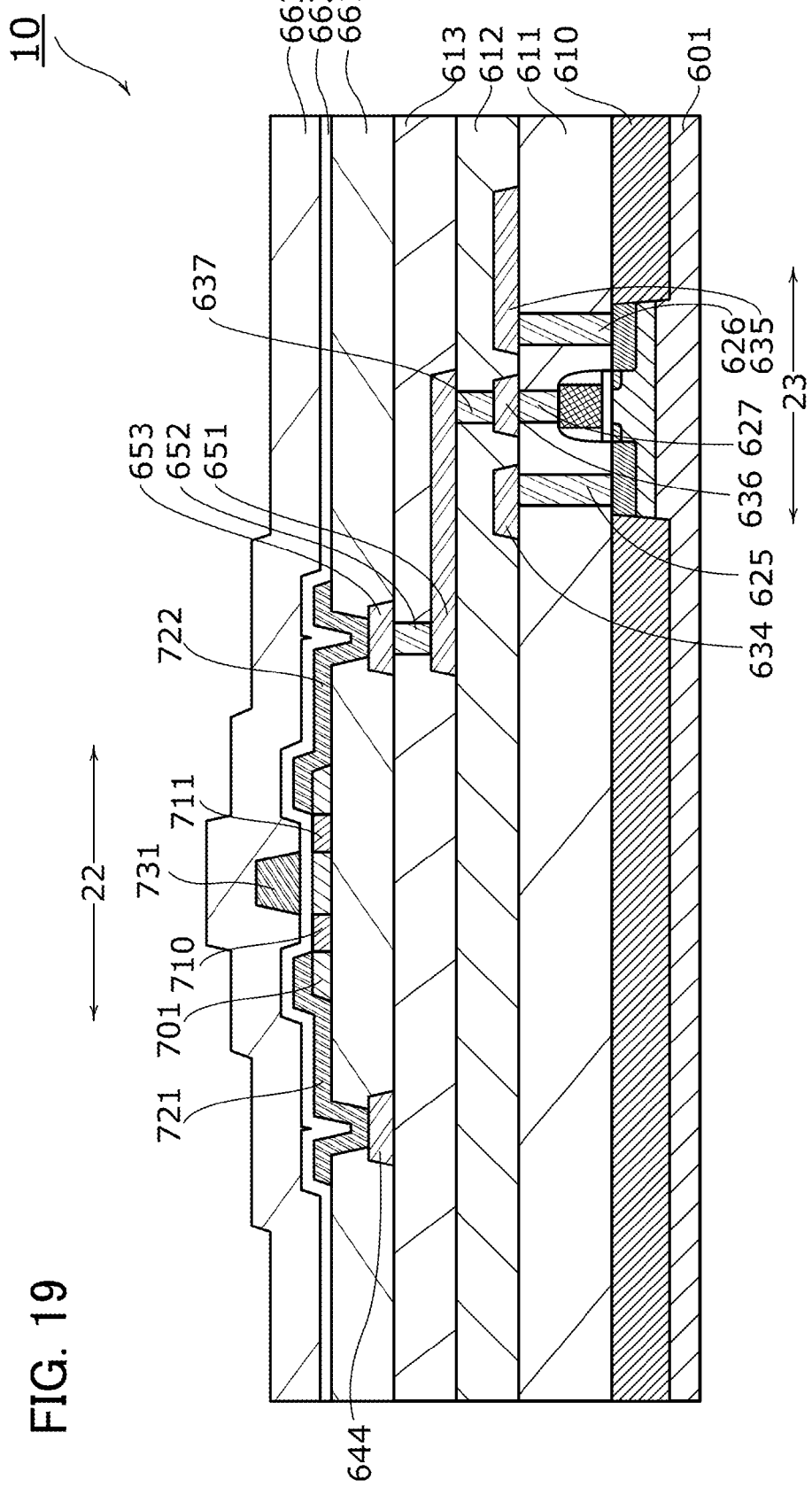
FIG. 19 illustrates a cross-sectional structure of a semiconductor device.

FIG. 19 illustrates an example of a cross-sectional structure of a semiconductor device 10 including the circuit 21 in FIG. 9.

In FIG. 19, the transistor 22 including a channel formation region in an oxide semiconductor film is formed over the transistor 23 including a channel formation region in a single crystal silicon substrate.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where the transistors each include a channel formation region in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 23 is formed can be, for example, a silicon substrate, a germanium substrate, or a silicon germanium substrate. In FIG. 19, a single crystal silicon substrate is used as the semiconductor substrate 601.

The transistor 23 is electrically isolated by an element isolation method. As the element isolation method, a selective oxidation method (a local oxidation of silicon (LOCOS) method), a trench isolation method (a shallow trench isolation (STI) method), or the like can be used. FIG. 19 illustrates an example where the trench isolation method is used to electrically isolate the transistor 23. Specifically, in FIG. 19, the transistor 23 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 23. Openings are formed in the insulating film 611. Conductive films 625 and 626 that are electrically connected to the source and the drain of the transistor 23 and a conductive film 627 that is electrically connected to the gate of the transistor 23 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 and 635. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 19, the transistor 22 is formed over the insulating film 661.

The transistor 22 includes, over the insulating film 661, a semiconductor film 701 including an oxide semiconductor, conductive films 721 and 722 functioning as source and drain electrodes over the semiconductor film 701, a gate insulating film 662 over the semiconductor film 701 and the conductive films 721 and 722, and a gate electrode 731 overlapping with the semiconductor film 701 over the gate insulating film 662 and between the conductive films 721 and 722. Note that the conductive film 722 is electrically connected to the conductive film 653 in the opening formed in the insulating film 661.

In the semiconductor film 701 of the transistor 22, there is a region 710 between a region overlapping with the conductive film 721 and a region overlapping with the gate electrode 731. In addition, in the semiconductor film 701 of the transistor 22, there is a region 711 between a region overlapping with the conductive film 722 and the region overlapping with the gate electrode 731. When an inert gas such as argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

An insulating film 663 is provided over the transistor 22.

In FIG. 19, the transistor 22 has the gate electrode 731 on at least one side of the semiconductor film 701; alternatively, the transistor 22 may have a pair of gate electrodes with the semiconductor film 701 positioned therebetween.

In the case where the transistor 22 has a pair of gate electrodes with the semiconductor film 701 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 19, the transistor 22 has a single-gate structure where one channel formation region corresponding to one gate electrode 731 is provided. However, the transistor 22 may have a multi-gate structure where a plurality of electrically connected gate electrodes are provided so that a plurality of channel formation regions are included in one active layer.

<Examples of Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 20A to 20F illustrate specific examples of these electronic devices.

Figure 20A:
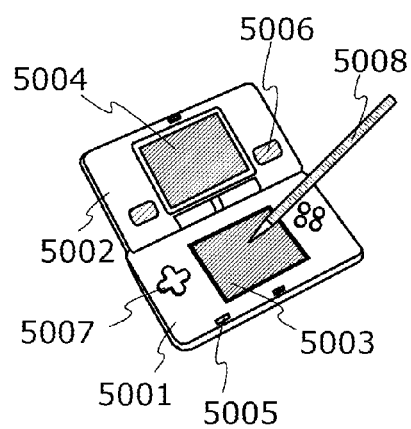
FIGS. 20A to 20F each illustrate an electronic device.

FIG. 20A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 20A has the two display portions 5003 and 5004, the number of display portions included in a portable game machine is not limited to this.

Figure 20B:
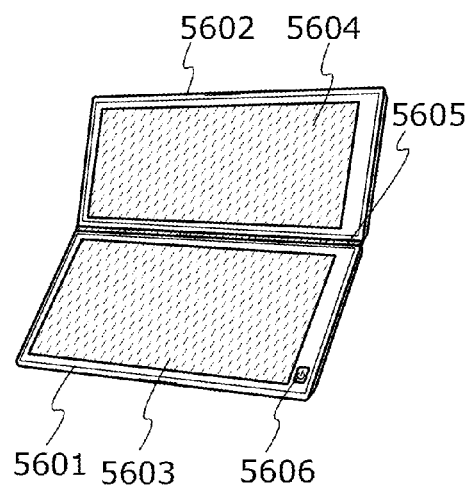

FIG. 20B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 20C:
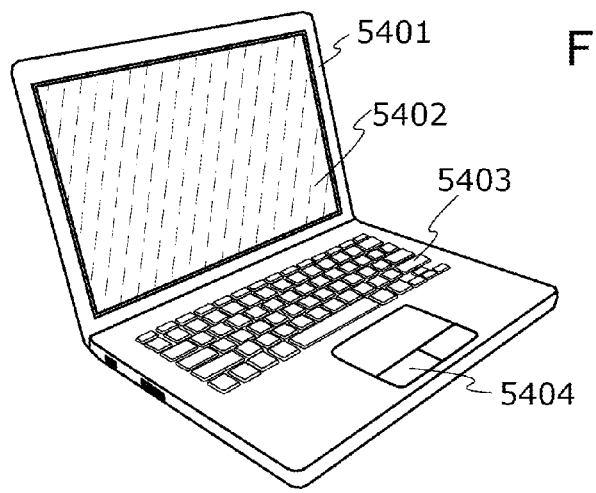

FIG. 20C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 20D:
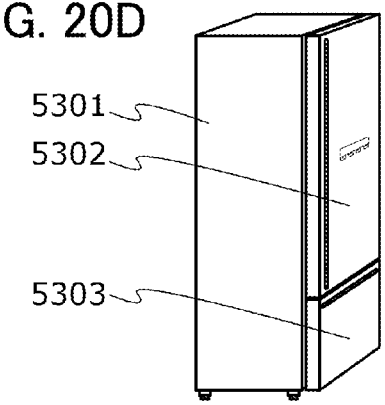

FIG. 20D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 20E:
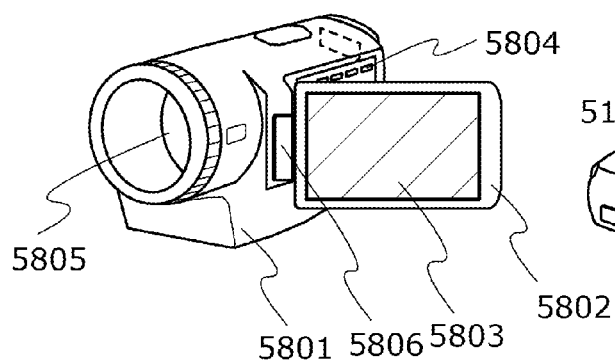

FIG. 20E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 20F:
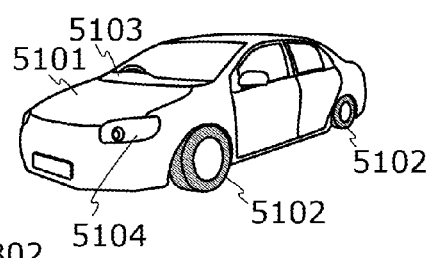

FIG. 20F illustrates a passenger car including a car body 5101, wheels 5102, a dashboard 5103, lights 5104, and the like. The semiconductor device of one embodiment of the present invention can be used for a variety of integrated circuits included in passenger cars.

This application is based on Japanese Patent Application serial no. 2014-022552 filed with Japan Patent Office on Feb. 7, 2014, the entire contents of which are hereby incorporated by reference.

What is claimed is:
1. A semiconductor device comprising:
a memory circuit,
wherein the semiconductor device is capable of storing a start-up routine in the memory circuit and executing the start-up routine,
wherein the semiconductor device is capable of operating the memory circuit as a buffer memory device after executing the start-up routine,
wherein the semiconductor device is capable of loading the start-up routine into the memory circuit from outside after operating the memory circuit as the buffer memory device and before powering off the semiconductor device,
wherein the memory circuit comprises a first transistor, a second transistor, a first circuit, and a second circuit,
wherein the first transistor and the second transistor are electrically connected to each other in series, wherein a gate of the first transistor is electrically connected to an output terminal of the first circuit,
wherein the gate of the first transistor is electrically connected to an input terminal of the second circuit,
wherein an input terminal of the first circuit is electrically connected to an output terminal of the second circuit,
wherein the first circuit comprises a third transistor and a fourth transistor,
wherein the second circuit comprises a fifth transistor and a sixth transistor,
wherein the first transistor, the second transistor, the third transistor, and the fifth transistor have a first polarity, and
wherein the fourth transistor and the sixth transistor have a second polarity.

2. The semiconductor device according to claim 1,
wherein the semiconductor device is capable of measuring a length of a period in which a supply of power to the semiconductor device is stopped, and
wherein the semiconductor device is capable of comparing the length of the period with a length of a preset period after the supply of power,
wherein the semiconductor device is capable of executing the start-up routine after loading the start-up routine into the memory circuit from outside when the period is longer than the preset period, and
wherein the semiconductor device is capable of executing the start-up routine stored in the memory circuit before the semiconductor device is powered off when the period is shorter than the preset period.

3. The semiconductor device according to claim 1,
wherein a channel portion of the first transistor, a channel portion of the second transistor, a channel portion of the third transistor, and a channel portion of the fifth transistor contain a first semiconductor material,
wherein a channel portion of the fourth transistor and a channel portion of the sixth transistor contain a second semiconductor material, and
wherein the second semiconductor material comprises an oxide semiconductor.

4. An electronic device comprising:
the semiconductor device according to claim 1; and
a housing, a display device, a microphone, or a speaker.

5. A semiconductor device comprising:
a memory circuit,
wherein the semiconductor device is capable of performing a first operation and performing a second operation,
wherein the semiconductor device is capable of being powered off between the first operation and the second operation,
wherein the semiconductor device is capable of storing a start-up routine of the semiconductor device in the memory circuit before the first operation,
wherein the semiconductor device is capable of executing the start-up routine in the first operation,
wherein the semiconductor device is capable of performing an operation based on a setting according to a data stored in the memory circuit in the second operation,
wherein the memory circuit comprises a first transistor, a second transistor, a first circuit, and a second circuit,
wherein the first transistor and the second transistor are electrically connected to each other in series,
wherein a gate of the first transistor is electrically connected to an output terminal of the first circuit,
wherein the gate of the first transistor is electrically connected to an input terminal of the second circuit,
wherein an input terminal of the first circuit is electrically connected to an output terminal of the second circuit,
wherein the first circuit comprises a third transistor and a fourth transistor,
wherein the second circuit comprises a fifth transistor and a sixth transistor,
wherein the first transistor, the second transistor, the third transistor, and the fifth transistor have a first polarity, and
wherein the fourth transistor and the sixth transistor have a second polarity.

6. The semiconductor device according to claim 5,
wherein the semiconductor device is capable of measuring a length of a period in which the semiconductor device is powered off,
wherein the semiconductor device is capable of comparing the length of the period with a length of a preset period after a supply of power,
wherein the semiconductor device is capable of executing the start-up routine after loading the start-up routine into the memory circuit from outside when the period is longer than the preset period, and
wherein the semiconductor device is capable of executing the start-up routine stored in the memory circuit before the semiconductor device is powered off when the period is shorter than the preset period.

7. The semiconductor device according to claim 5,
wherein the memory circuit operates as a buffer memory device in the second operation.

8. The semiconductor device according to claim 5, further comprising:
a logic circuit,
wherein the logic circuit comprises a plurality of third circuits, and
wherein the memory circuit is capable of controlling electrical connection between the plurality of third circuits according to the data.

9. The semiconductor device according to claim 5,
wherein a channel portion of the first transistor, a channel portion of the second transistor, a channel portion of the third transistor, and a channel portion of the fifth transistor contain a first semiconductor material,
wherein a channel portion of the fourth transistor and a channel portion of the sixth transistor contain a second semiconductor material, and
wherein the second semiconductor material comprises an oxide semiconductor.

10. An electronic device comprising:
the semiconductor device according to claim 5; and
a housing, a display device, a microphone, or a speaker.

11. A semiconductor device comprising:
a memory circuit,
wherein the semiconductor device is capable of performing a first operation, being powered off, and then performing a second operation,
wherein the semiconductor device is capable of performing an operation based on a first setting according to a data stored in the memory circuit in the first operation,
wherein the semiconductor device is capable of storing a second setting of the semiconductor device in the memory circuit before the semiconductor device is powered off,
wherein the semiconductor device is capable of executing a program for the second setting of the semiconductor device in the second operation,
wherein the memory circuit comprises a first transistor, a second transistor, a first circuit, and a second circuit, wherein the first transistor and the second transistor are electrically connected to each other in series, wherein a gate of the first transistor is electrically connected to an output terminal of the first circuit, wherein the gate of the first transistor is electrically connected to an input terminal of the second circuit, wherein an input terminal of the first circuit is electrically connected to an output terminal of the second circuit, wherein the first circuit comprises a third transistor and a fourth transistor, wherein the second circuit comprises a fifth transistor and a sixth transistor, and wherein the first transistor, the second transistor, the third transistor, and the fifth transistor have a first polarity.

12. The semiconductor device according to claim 11, wherein the semiconductor device is capable of measuring a length of a period in which the semiconductor device is powered off, wherein the semiconductor device is capable of comparing the length of the period with a length of a preset period after a supply of power, and wherein the semiconductor device is capable of executing the program for the second setting of the semiconductor device when the period is shorter than the preset period.

13. The semiconductor device according to claim 11, wherein the memory circuit operates as a buffer memory device in the first operation.

14. The semiconductor device according to claim 11, further comprising:

a logic circuit, wherein the logic circuit comprises a plurality of third circuits, and wherein the memory circuit is capable of controlling electrical connection between the plurality of third circuits according to the data.

15. The semiconductor device according to claim 11, wherein a channel portion of the first transistor, a channel portion of the second transistor, a channel portion of the third transistor, and a channel portion of the fifth transistor contain a first semiconductor material, wherein a channel portion of the fourth transistor and a channel portion of the sixth transistor contain a second semiconductor material, and wherein the second semiconductor material comprises an oxide semiconductor.

16. An electronic device comprising:

the semiconductor device according to claim 11; and a housing, a display device, a microphone, or a speaker.

* * * * *